US008908117B2

(12) United States Patent
Hayashi et al.

(10) Patent No.: US 8,908,117 B2
(45) Date of Patent: Dec. 9, 2014

(54) THIN FILM TRANSISTOR ARRAY SUBSTRATE AND LIQUID CRYSTAL DISPLAY APPARATUS COMPRISING A TRANSPARENT CONDUCTIVE FILM PATTERN HAVING A FIRST TYPE PATTERN AND A SECOND TYPE PATTERN

(75) Inventors: Masami Hayashi, Kumamoto (JP);
Osamu Miyagawa, Kumamoto (JP);
Toru Takeguchi, Kumamoto (JP);
Shinichi Yano, Kumamoto (JP);
Yasuyoshi Itoh, Kumamoto (JP); Shingo Nagano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 562 days.

(21) Appl. No.: 13/281,893

(22) Filed: Oct. 26, 2011

(65) Prior Publication Data
US 2012/0113376 A1 May 10, 2012

(30) Foreign Application Priority Data
Nov. 4, 2010 (JP) ................................. 2010-247542

(51) Int. Cl.
*G02F 1/136* (2006.01)
*G02F 1/1343* (2006.01)
*G02F 1/1345* (2006.01)
*H01L 27/12* (2006.01)
*G02F 1/1362* (2006.01)

(52) U.S. Cl.
CPC .......... *H01L 27/124* (2013.01); *G02F 1/13452* (2013.01); *G02F 1/136286* (2013.01)
USPC ............................................. 349/43; 349/139

(58) Field of Classification Search
USPC .............................................. 349/42–50, 52
See application file for complete search history.

(56) References Cited

U.S. PATENT DOCUMENTS 4,961,629 A 10/1990 Kato
5,636,329 A 6/1997 Sukegawa et al.
(Continued)

FOREIGN PATENT DOCUMENTS

| JP | 1-123475 | 5/1989 |
| JP | 6-27477 A | 2/1994 |
| JP | 8-6059 | 1/1996 |
| JP | H09-203912 A | 8/1997 |
| JP | 10-253992 A | 9/1998 |

(Continued)

OTHER PUBLICATIONS

Japanese Office Action issued Sep. 30, 2014, in Japanese Patent Application No. 2010-247542 with English-language Translation, 6 pages.

*Primary Examiner* — Paul Lee
(74) *Attorney, Agent, or Firm* — Oblon, Spivak, McClelland, Maier & Neustadt, L.L.P.

(57) ABSTRACT

A thin film transistor array substrate of the present invention having an array area, and a frame area, the thin film transistor array substrate includes: a thin film transistor; an upper metal pattern formed by the same material as source and drain electrodes at the same layer; a transparent conductive film pattern; and an upper layer insulation film, wherein the transparent conductive film pattern has: a first-type transparent conductive film pattern provided to located within one of a pattern of the electrode pattern and a pattern of the metal pattern, as viewed from the top side, and to not cover pattern end faces of the electrode pattern or the metal pattern; and a second-type transparent conductive film pattern provided to stick out from an inside of at least a portion of one of the patterns, as viewed from the top side and to cover the pattern end faces.

15 Claims, 20 Drawing Sheets

(56) References Cited

U.S. PATENT DOCUMENTS

| | | | |
|---|---|---|---|
| 6,081,308 A * | 6/2000 | Jeong et al. | 349/42 |
| 6,373,546 B1 | 4/2002 | Kim | |
| 6,614,500 B2 | 9/2003 | Kim | |
| 7,435,629 B2 | 10/2008 | Youn | |
| 2002/0101548 A1 | 8/2002 | Kim | |
| 2006/0038178 A1 | 2/2006 | Youn | |
| 2009/0002587 A1 | 1/2009 | Youn | |
| 2009/0251653 A1 | 10/2009 | Hayashi | |

FOREIGN PATENT DOCUMENTS

| | | |
|---|---|---|
| JP | 10-333182 A | 12/1998 |
| JP | 2001-154221 A | 6/2001 |
| JP | 2001-174818 A | 6/2001 |
| JP | 2003-338219 A | 11/2003 |
| JP | 2004-247533 A | 9/2004 |
| JP | 2006-72355 A | 3/2006 |
| JP | 2008-135598 A | 6/2008 |

* cited by examiner

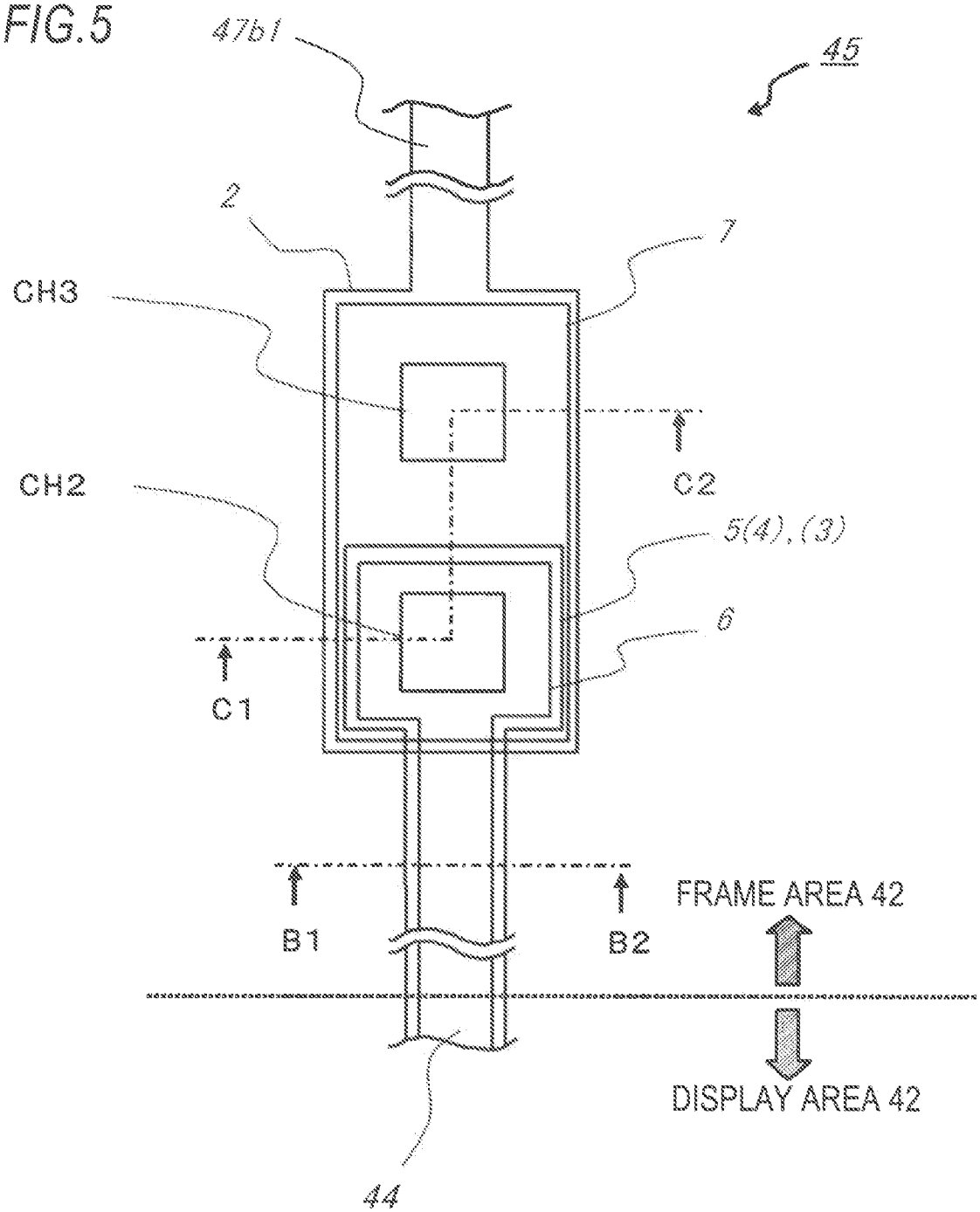

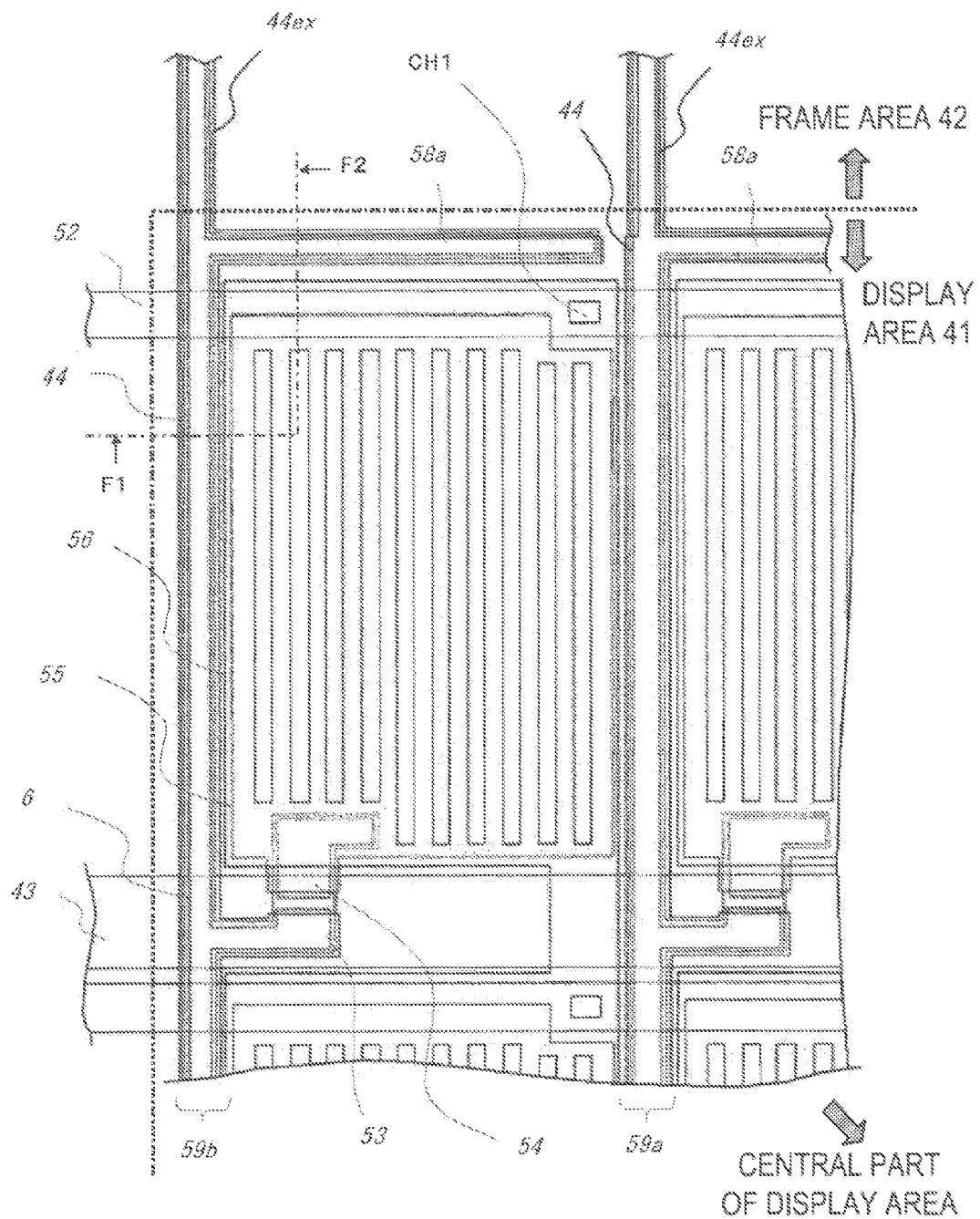

DISPLAY AREA 41
(AROUND TFT51)

FRAME AREA 42
(AROUND
WIRING CONVERSION PART 45)

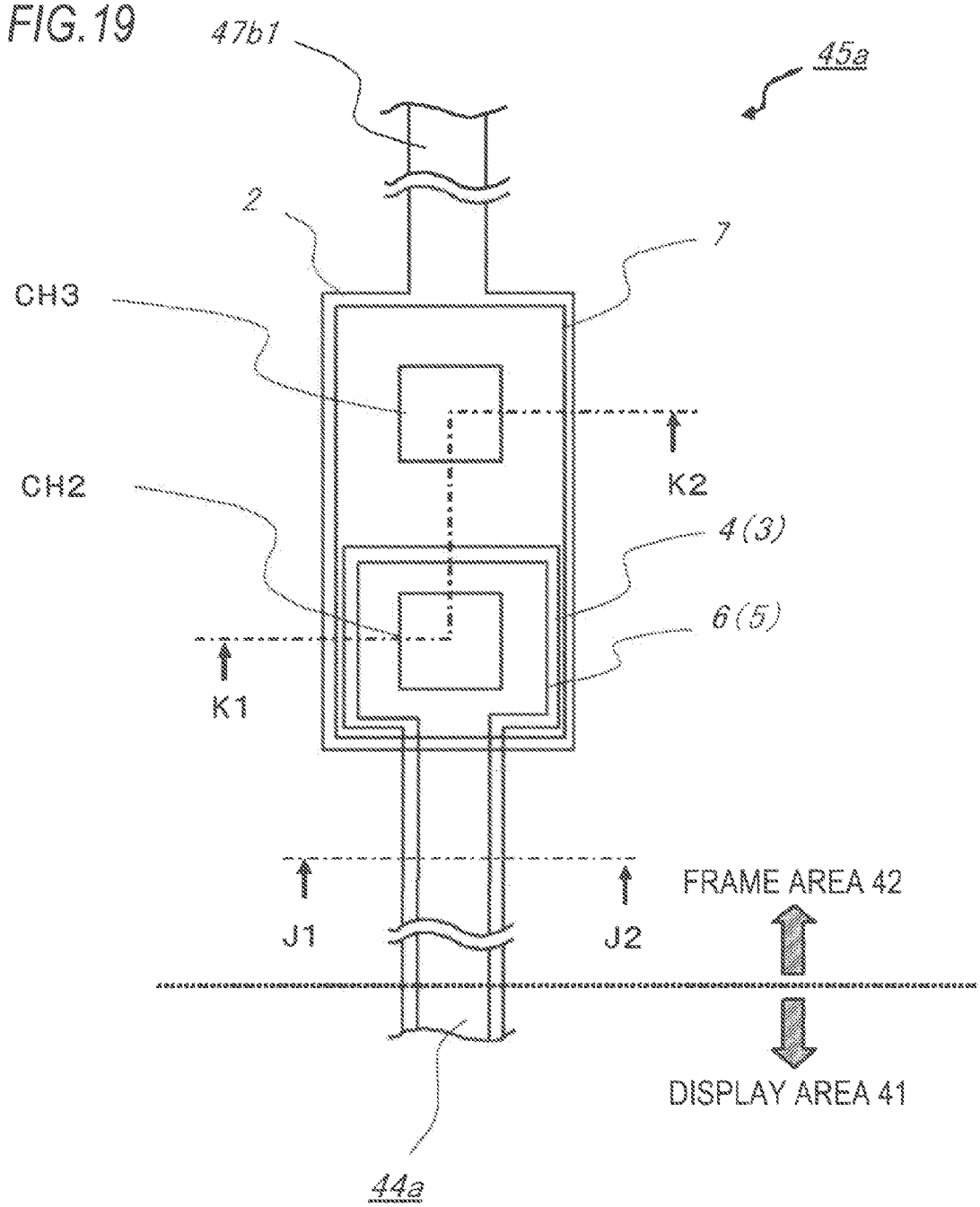

THIN FILM TRANSISTOR ARRAY SUBSTRATE AND LIQUID CRYSTAL DISPLAY APPARATUS COMPRISING A TRANSPARENT CONDUCTIVE FILM PATTERN HAVING A FIRST TYPE PATTERN AND A SECOND TYPE PATTERN

CROSS-REFERENCE TO RELATED APPLICATION

This application claims priority from Japanese Patent Application No. 2010-247542 filed on Nov. 4, 2010, the entire subject matter of which is incorporated herein by reference.

BACKGROUND

The present invention relates to a thin film transistor array substrate having a transparent conductive film and a liquid crystal display apparatus. Specifically, the present invention relates to a wiring structure around the transparent conductive film.

A transparent conductive film is used in a thin film electronic device, such as a terminal electrode, which configures an external connection terminal face of a thin film transistor array substrate (hereinafter, referred to as TFT array substrate) on which thin film transistors (TFTs) are arranged in an array form, a transparent electrode for a display apparatus, and the like. For example, JP-A-01-123475 discloses a liquid crystal display apparatus in which a transparent conductive film such as ITO (Indium Tin Oxide) is used for a pixel electrode and JP-A-08-6059 discloses an active matrix substrate of a liquid crystal display apparatus in which a transparent conductive film made of ITO is provided on an external connection terminal face layer.

SUMMARY

Specifically, when a transparent conductive film pattern formed by the transparent conductive film is formed at the uppermost layer, as JP-A-01-123475, a problem may be not caused. However, when an upper layer insulation film such as protective film and interlayer insulation film is formed on the transparent conductive film pattern, as JP-A-01-123475, a film-floating or film-peeling (hereinafter, referred to as delamination) may be caused. In the delamination, the upper layer insulation film is peeled off from an end of a transparent conductive film pattern, depending on balance of stress of the transparent conductive film and stress of the upper layer insulation film. The delamination is remarkably caused in a part, in which a pattern density is relatively low such as outer frame area, an external connection terminal part or wiring conversion part, rather than a display area. When the delamination is caused, the upper insulation film does not function as a protective film, so that the corrosion is caused. Incidentally, the upper insulation film does not function as an interlayer insulation film, so that the insulation breakdown is caused. In any case, the yield rate and reliability of a product are deteriorated by the delamination. Furthermore, the peeled upper insulation film may be scattered in a manufacturing apparatus and the dust is thus caused, thereby exerting a bad influence on the other products being manufactured in the same apparatus. As a result, the yield rates and reliability of all products to be manufactured is deteriorated.

To the contrary, in forming the upper insulation film, if a formation condition, in which the stress balance is satisfied and the delamination is difficult to occur, is adopted, the transmittance on the transparent conductive film is lowered, and a wedge is formed at a interface of the gate insulation film and an interlayer insulation film in a contact hole connecting a wiring and a pixel electrode, so that the poor connection is caused. Specifically, in recent years, in a liquid crystal display apparatus that requires high brightness (high opening rate, high transmittance) and high view angle, it is necessarily required to improve the transmittance of the transparent conductive film and required to adopt a fringe field switching (FFS) mode, so that the film formation condition in which the delamination is easily caused is inevitably adopted in many cases. Furthermore, in the FFS mode, the pixel electrode and opposite electrode made of the transparent conductive film, should be arranged with sandwiching an interlayer insulation film therebetween. Accordingly, the interlayer insulation film is to be arranged on at least one of the transparent electrodes and inevitably is to be the upper layer insulation film with respect to either of electrodes. As a result, it is necessary to solve the described delamination problem of the upper layer insulation film.

In view of the above, the present invention provides a thin film transistor array substrate and a liquid crystal display apparatus capable of preventing or suppressing a delamination of an insulation film, which is formed at an upper layer of a transparent conductive film, thereby improving yield rate and reliability.

A thin film transistor array substrate of the present invention having an array area, in which thin film transistors are arranged in an array shape, and a frame area, which is provided to surround the array area, the thin film transistor array substrate comprising: a thin film transistor includes: a substrate; a gate electrode formed on the substrate; a gate insulation film that covers the substrate and also covers the gate electrode; a semiconductor layer formed on the gate insulation film above the gate electrode; and a source electrode and a drain electrode formed above the semiconductor layer with sandwiching an ohmic contact film; an electrode pattern configured by the source electrode and the drain electrode; an upper metal pattern formed by the same material as the source and drain electrodes at the same layer; a transparent conductive film pattern formed to directly overlap with at least one of the electrode pattern and the upper metal pattern; and an upper layer insulation film that covers the gate insulation film and also covers the transparent conductive film pattern, wherein the transparent conductive film pattern has: a first-type transparent conductive film pattern that is provided to located within one of a pattern of the electrode pattern and a pattern of the upper metal pattern, as viewed from the top side, wherein a first-type transparent conductive film pattern is formed to not cover pattern end faces of the electrode pattern or the upper metal pattern; and a second-type transparent conductive film pattern that is provided to stick out from an inside of at least a portion of one of the electrode pattern and the upper metal pattern, as viewed from the top side, wherein the second-type transparent conductive film pattern is stuck out to cover the pattern end faces of the electrode pattern or the upper metal pattern, and wherein the transparent conductive film pattern formed at least in the frame area is configured by the first-type transparent conductive film pattern formed to not cover the pattern end faces of the electrode pattern or the upper metal pattern.

According to the present invention, in the TFT array substrate having the transparent conductive film, it is possible to prevent or suppress the delamination of the insulation film formed at the upper layer of the transparent conductive film.

BRIEF DESCRIPTION OF THE DRAWINGS

The foregoing and additional features and characteristics of the present invention will become more apparent from the following detailed descriptions considered with the reference to the accompanying drawings, wherein:

FIG. 5 is a plan view illustrating a wiring conversion part of the TFT array substrate according to the first illustrative embodiment of the present invention;

FIG. 9 is a plan view illustrating the outermost periphery display area of the TFT array substrate according to the first illustrative embodiment of the present invention;

FIG. 19 is a plan view illustrating a wiring conversion part of the TFT array substrate according to the second illustrative embodiment of the present invention;

DETAILED DESCRIPTION

First Illustrative Embodiment

Figure 1:
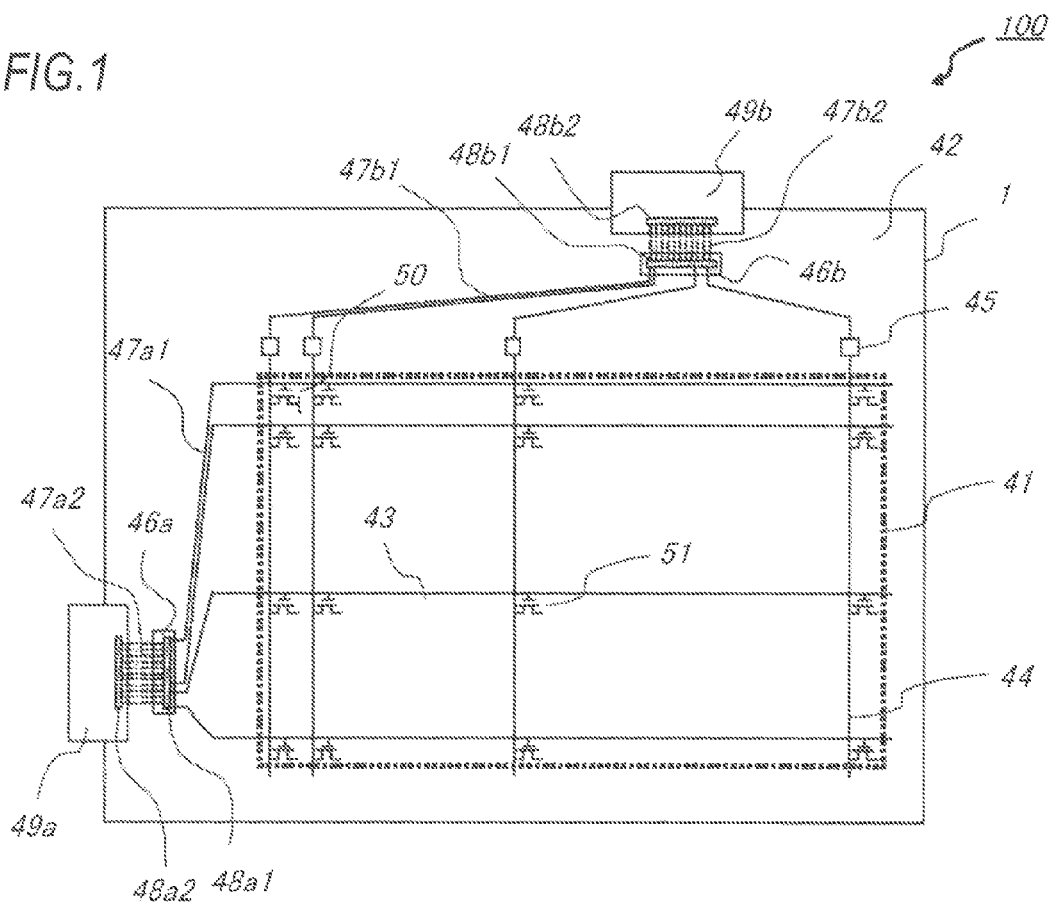
FIG. 1 is a plan view illustrating a configuration of a TFT array substrate that is used in a liquid crystal display apparatus according to a first illustrative embodiment of the present invention.

Hereinafter, the preferred illustrative embodiments of the present invention will be described. The following descriptions are to explain the illustrative embodiments of the present invention. The present invention is not limited to the illustrative embodiments. In addition, the below descriptions and the drawings are appropriately omitted and simplified for clear explanations. The drawings are pictorial and do not reflect the exact sizes of the constitutional elements shown. In the meantime, the same reference numerals in the drawings indicate the same constitutional elements and the overlapped descriptions will be appropriately omitted.

First, as a first illustrative embodiment of the present invention, an example, in which the present invention is applied to a liquid crystal display apparatus including a TFT array substrate having a transparent conductive film, will be described. FIG. 1 is a plan view illustrating a TFT array substrate 100 that configures a liquid crystal display apparatus according to a first illustrative embodiment. In the TFT array substrate 100 that configures a liquid crystal display apparatus according to a first illustrative embodiment, TFTs 51, which are switching devices of controlling on and off of display voltage to be supplied to liquid crystals, are arranged in correspondence to pixels 50 each of which is a unit to display an image on a substrate. Since the TFTs 51 are arranged in an array shape for each of the pixels 50, the substrate, on which the TFTs 51 are arranged, is referred to as the TFT array substrate 100.

The TFT array substrate 100 has a substrate 1. The substrate 1 is made of glass or semiconductor, for example. The TFT array substrate 100 is has an array area, in which the TFTs 51 are arranged in an array shape, and a frame area provided to surround the array area. Specifically, in a display apparatus such as a liquid crystal display apparatus, the array area in which the TFTs 51 are arranged in an array shape corresponds to a display area 41 (area surrounded by the dotted line in FIG. 1) that is an area to display an image, and the frame area provided to surround the array area corresponds to a frame area 42 (area of the TFT array substrate except for the area surrounded by the dotted line in FIG. 1) that is provided to surround the display area 41. In the display area 41, a plurality of gate wirings (scanning signal lines) 43 and a plurality of source wirings (display signal lines) 44 are formed. The gate wirings 43 are parallel with each other. Likewise, the source wirings 44 are also parallel with each other. The gate wirings 43 and the source wirings 44 are formed to intersect with each other. An area that is located within the gate wiring 43 and the source wiring 44 adjacent to each other is to be a pixel 50. Accordingly, in the display area 41, the pixels 50 are arranged in a matrix shape.

In the frame area 42 of the TFT array substrate 100, a scanning signal driving circuit 46*a*, a display signal driving circuit 46*b*, a wiring conversion part 45, leader wirings 47*a*1, 47*a*2, 47*b*1, 47*b*2, external connection terminals 48*a*1, 48*a*2, 48*b*1, 48*b*2 and the like are provided. The gate wirings 43 extend from the display area 41 to the frame area 42, and the gate wirings 43 are led to an end portion of the TFT array substrate 100 by the leader wirings 47*a*1, which are formed by the same material as the gate wirings 43 in the frame area 42. Further, the gate wirings 43 are connected to the scanning signal driving circuit 46*a* through the external connection terminals 48*a*1 arranged at end portions of the leader wirings 47*a*1, at the end portion of the TFT array substrate 100. The source wirings 44 are electrically connected to a first conductive film 2, which is formed at the same layer by the same material as the gate wirings 43 at the wiring conversion parts 45, and the source wirings 44 are led to an end portion of the TFT array substrate 100 by the leader wirings 47*b*1 formed by the first conductive film. Further, the source wirings 44 are connected to the display signal driving circuit 46*b* through the external connection terminals 48*b*1 arranged at end portions of the leader wirings 47*b*1, at the end portion of the TFT array substrate 100. An external wiring 49*a* is connected through the leader wirings 47*a*2 and the external connection terminals 48*a*2 near the scanning signal driving circuit 46*a*. In addition, an external wiring 49*b* is connected through the leader wirings 47*b*2 and the external connection terminals 48*b*2 near the display signal driving circuit 46*b*. The external wirings 49*a*, 49*b* are wiring substrates such as FPC (Flexible Printed Circuit).

A variety of signals are supplied from the outside to the scanning signal driving circuit 46*a* through the external wiring 49*a* and the leader wirings 47*a*2, and another variety of signals are supplied from the outside to the display signal driving circuit 46*b* through the external wiring 49*b* and the leader wirings 47*b*2. The scanning signal driving circuit 46*a* supplies a gate signal (scanning signal) to the gate wirings 43, based on the control signals from the outside. By the gate signal, the gate wirings 43 are sequentially selected. The display signal driving circuit 46*b* supplies a display signal to the source wirings 44, based on the control signals from the outside or display data. Thereby, it is possible to supply the display voltage corresponding to the display data to the respective pixels 50.

At least one TFT 51 is formed in the pixel 50. The TFT 51 is arranged adjacent to the intersection of the source wiring 44 and the gate wiring 43. For example, the TFT 51 supplies the display voltage to the pixel electrode. In other words, the TFT 51 as a switching device is driven by the gate signal from the gate wiring 43. Thereby, the display potential is applied from the source wiring 44 to the pixel electrode connected to the drain electrode of the TFT 51. Additionally, the pixel electrode is a flat plate-shaped electrode and is opposed to a common electrode (opposite electrode) having a comb-shape electrode or slit electrode via an insulation film. The common electrode (opposite electrode) is applied with a common potential and a fringe electric field corresponding to the display voltage (potential difference between the display potential and the common potential) is generated between the pixel electrode and the opposite electrode. In the meantime, the detailed configuration of the pixel 50 will be described later.

Figure 2:
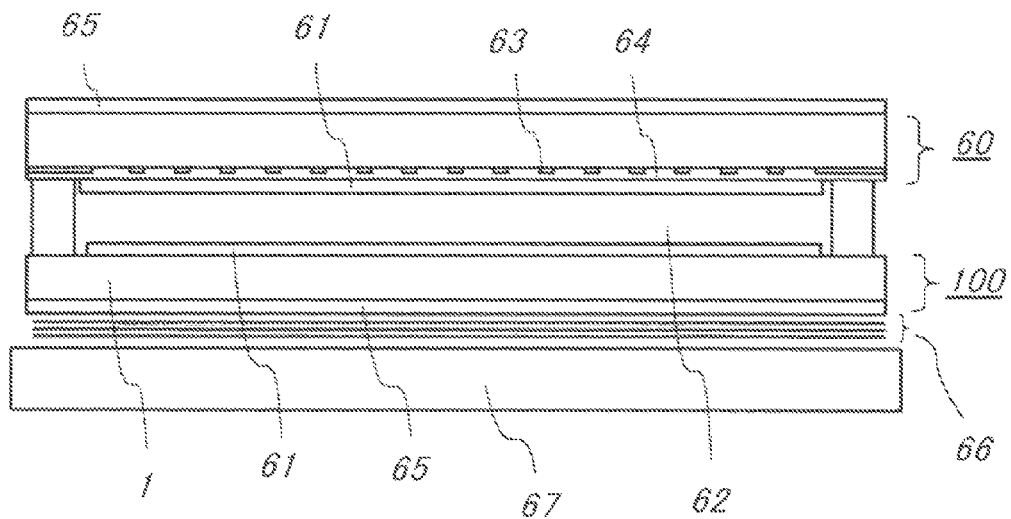
FIG. 2 is a sectional view illustrating a liquid crystal display apparatus according to the first illustrative embodiment of the present invention.

Continuously, the overall configuration of the liquid crystal display apparatus according to the first illustrative embodiment is described with reference to the sectional view of FIG. 2. As shown in FIG. 2, an alignment film 61 is formed on a face of the TFT array substrate 100 that has been described in the above. In addition, an opposite substrate 60 is disposed to face the TFT array substrate 100. The opposite substrate 60 is a color filter substrate, for example, and is disposed at a side to be visually recognized. The opposite substrate 60 is formed with a color filter 64, a black matrix (BM) 63, an alignment film 61 and the like. A liquid crystal layer 62 is sandwiched between the TFT array substrate 100 and the opposite substrate 60. In other words, the liquid crystals are introduced between the TFT array substrate 100 and the opposite substrate 60. Further, polarization plates 65 are provided on outer faces of the TFT array substrate 100 and the opposite substrate 60, and then a liquid crystal display panel is configured. Also, a backlight unit 67 is arranged on a backside of the TFT array substrate 100, which is opposite to the visible side of the liquid crystal display panel, with optical films 66 such as phase difference plate being interposed between the TFT array substrate and the backlight unit. The liquid crystal display panel and the peripheral members are appropriately accommodated in a frame (not shown) made of resin, metal and the like. The liquid crystal display apparatus of the first illustrative embodiment is configured as described above.

The liquid crystals are driven by the fringe electric field between the pixel electrodes and the opposite electrodes. In other words, the orientation direction of the liquid crystals between the substrates is changed. Thereby, a polarization state of the light passing through the liquid crystal layer 62 is changed. In other words, as it passes through the polarization plate 65 is changed by the liquid crystal layer 62, the polarization state of the light that is to be linear polarized light. Specifically, the light from the backlight unit 67 is to be the linear polarized light by the polarization plate 65 arranged on the TFT array substrate. As the linear polarized light passes through the liquid crystal layer 62, the polarized state thereof is to be changed. An amount of light passing through the polarization plate 65 arranged on the opposite substrate 60 is changed depending on the polarization state. In other words, an amount of light, which passes through the polarization plate 65 at the visible side, of the transmitted light transmitting the liquid crystal display panel from the backlight unit 67 is changed. The orientation direction of the liquid crystals is changed by the display voltage being applied. Accordingly, it is possible to change the amount of light passing through the polarization plate 65 at the visible side by controlling the display voltage. In other words, it is possible to display a desired image by changing the display voltage for each pixel 50.

Figure 3:
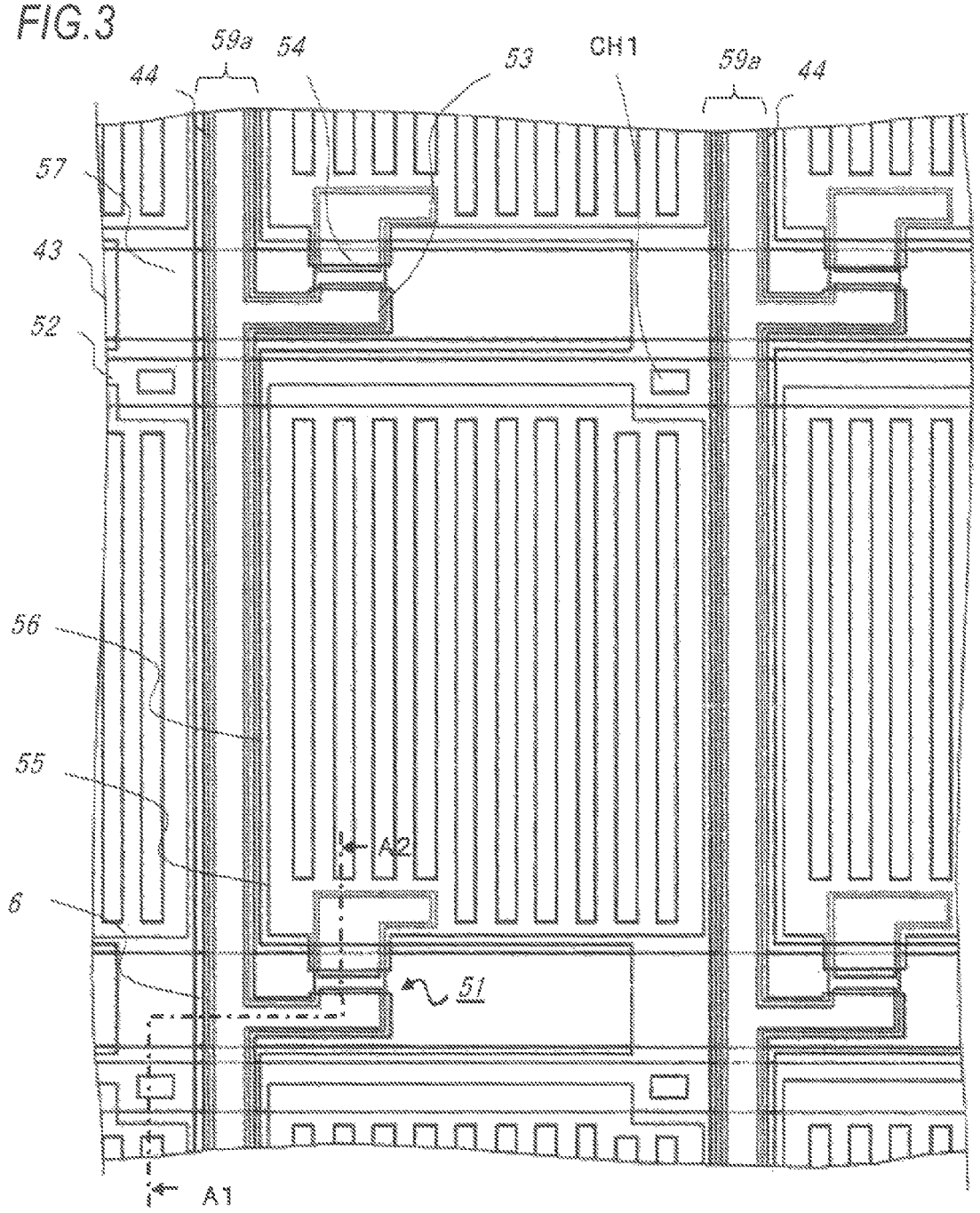
FIG. 3 is a plan view illustrating a display area except for the outermost periphery of a TFT array substrate according to the first illustrative embodiment of the present invention.
Figure 4:
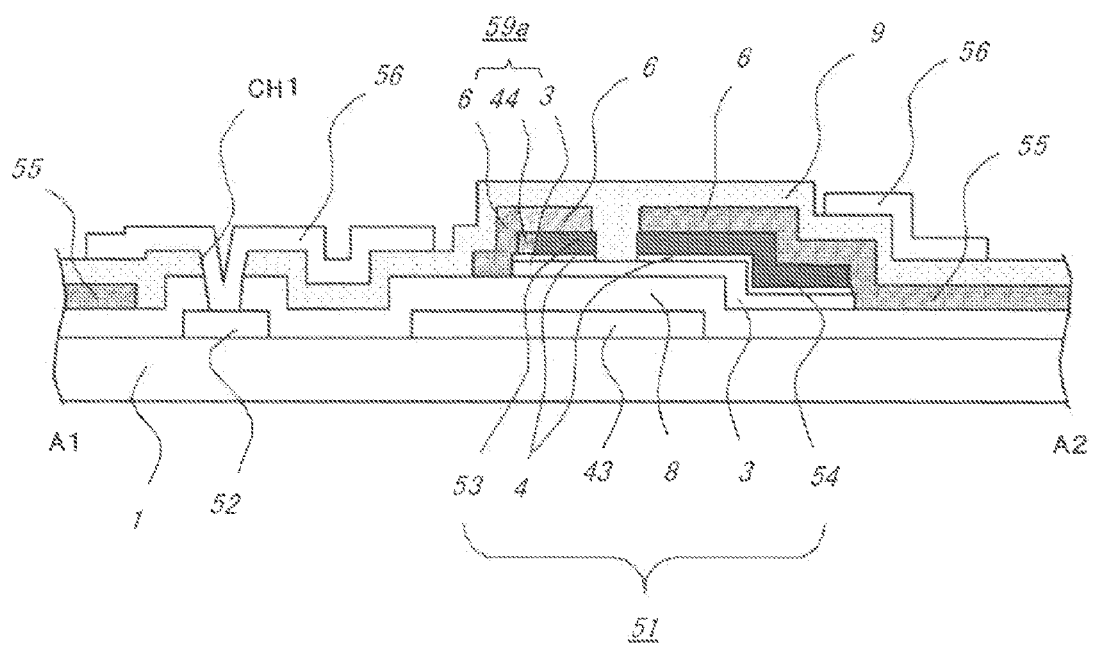
FIG. 4 is a sectional view illustrating the display area except for the outermost periphery of the TFT array substrate according to the first illustrative embodiment of the present invention.

Next, the detailed configuration of the display area 41 of the liquid crystal display apparatus of the first illustrative embodiment, in which the TFTs 51 are arranged, is described with reference to FIGS. 3 and 4. FIG. 3 is a plan view illustrating a pixel configuration near the center of the display area 41 of the TFT array substrate 100 according to the first illustrative embodiment, and FIG. 4 is a sectional view taken along a line A1-A2 of FIG. 3. The pixel configuration is common except for the outermost periphery pixel 50 of the display area 41 and the periphery thereof. The configurations of the outermost periphery pixel 50 of the display area 41 and the periphery thereof will be specifically described in the below.

In FIGS. 3 and 4, the gate wiring 43 connected to the gate electrode of the TFT 51 is formed on the substrate 1 made of insulating material such as glass substrate. Here, the gate wiring 43 is formed so that a part thereof configures the gate electrode. The gate wiring 43 is provided to linearly extend in one direction on the substrate 1. In addition, a plurality of common wirings 52 is formed on the same layer as the gate wiring 43 on the substrate 1. The common wiring 52 is arranged between the adjacent gate wirings 43. The plurality of common wirings 52 is provided to be parallel with each other. The common wiring 52 and the gate wiring 43 are provided to be substantially parallel with each other. The gate electrode, the gate wiring 43 and the common wiring 52 are formed by the first conductive film 2 that is made of high melting metal, low resistance metal, such as Cr, Al, Ta, Ti, Mo, W, Ni, Cu, Au, Ag and the like, alloy film having the metals as main components or a stacked film thereof.

A semiconductor layer 3 is formed on a first insulation film 8 that is to be a gate insulation film. In the first illustrative embodiment, the semiconductor layer 3 is linearly formed to intersect the gate wiring 43 and the common wiring 52. Here, the semiconductor layer 3 orthogonally intersects the gate wiring 43 and the common wiring 52, for example. The semiconductor layer 3 is provided to linearly extend in a direction of intersecting with the gate wiring 43 on the substrate 1. A plurality of the semiconductor layer 3 is provided at an interval. The semiconductor layer 3 is branched from the intersection with the gate wiring 43. The branched semiconductor layer 3 extends along the gate wiring 43 and further extends into the pixel 50. In the formation area of the TFT 51, the semiconductor layer 3 is provided at an opposite face to the gate electrode with sandwiching the first insulation film 8 therebetween. In other words, a part overlapping with the gate electrode of the semiconductor layer 3 branched from the intersection with the gate wiring 43 functions as an active area configuring the TFT 51. Here, the active area of the semiconductor layer 3 is formed on the first insulation film 8 so that it overlaps with the gate wiring 43. The semiconductor layer 3 is formed of amorphous silicon, polycrystalline silicon and the like. In the meantime, the linear semiconductor layer 3 extending in a direction of intersecting with the gate wiring 43 can be used as a redundant wiring of the source wiring 44, which will be described later. In other words, the linear semiconductor layer 3 is formed to meet the formation area of the source wiring 44 and is possible to suppress the interruption of an electric signal even if the source wiring 44 is disconnected.

In addition, an ohmic contact film 4 having conductive impurities doped therein is formed on the semiconductor layer 3. The ohmic contact film 4 is provided on the substantially entire face of the semiconductor layer 3, except for a channel area of the TFT 51. Areas of the semiconductor layer 3 overlapping with the gate electrode and corresponding to the ohmic contact film 4 become source and drain areas. Specifically, an area of the semiconductor layer 3, which overlaps with the gate electrode (gate wiring 43) and corresponds to the ohmic contact film 4 of left side in FIG. 4, is to be a source area. An area of the semiconductor layer 3, which overlaps with the gate electrode (gate wiring 43) and corresponds to the ohmic contact film 4 of right side in FIG. 4, is to be a drain area. An area of the semiconductor layer 3 sandwiched between the source and drain areas is to be a channel area. The ohmic contact film 4 is not formed on the channel area of the semiconductor layer 3. The ohmic contact film 4 is made of n-type amorphous silicon or n-type polycrystalline silicon in which impurities, such as phosphorous (P), of high concentration are doped.

A source electrode 53, a drain electrode 54 and the source wiring 44 are formed on the ohmic contact film 4. Specifically, the source electrode 53 is formed on the ohmic contact film 4, with corresponding to the source area of the semiconductor layer 3. The drain electrode 54 is formed on the ohmic contact film 4 of the drain area. Like this, a channel etch type TFT 51 is configured. The source electrode 53 and the drain electrode 54 are formed to extend to the outsides of the channel area of the semiconductor layer 3. In other words, the source electrode 53 and the drain electrode 54 are not formed on the channel area of the semiconductor layer 3, like the ohmic contact film 4. In addition, the source electrode 53 extends to the outside of the channel area of the semiconductor layer 3 and is coupled to the source wiring 44. In other words, the source wiring 44 is connected to the source electrode 53. The source wiring 44 is formed above the semiconductor layer 3 with sandwiching the ohmic contact film 4, and the source wiring 44 is provided to linearly extend in a direction of intersecting with the gate wiring 53 on the substrate 1. Accordingly, the source wiring 44 is branched from the intersection with the gate wiring 43, and then the source wiring 44 extends along the gate wiring 43 and is to be the source electrode 53. The source electrode 53, the drain electrode 54 and the source wiring 44 are the metal patterns formed by the second conductive film 5 made of high melting metal, low resistance metal, such as Cr, Al, Ta, Ti, Mo, W, Ni, Cu, Au, Ag and the like, alloy film having the metals as main components, or a stacked film thereof. In other words, the source wiring 44 is a metal pattern formed at the same layer by the same material as the source electrode 53 and the drain electrode 54. Like this, in the first illustrative embodiment, the semiconductor layer 3 is formed on the substantially entire face below the source wiring 44, on the substantially entire face below the source electrode 53, on the substantially entire face below the drain electrode 54 and on the opposite face to the gate electrode. Here, the ohmic contact film 4 is respectively formed between the semiconductor layer 3 and the source wiring 44, the source electrode 53 and the drain electrode 54 and. In addition, the drain electrode 54 extends to the outside of the channel area of the semiconductor layer 3 and is electrically connected to the pixel electrode 55.

In the first illustrative embodiment, the pixel electrode 55 is formed on the drain electrode 54 to directly overlap. In other words, a lower face (a face of a lower side) of the pixel electrode 55 is directly contacted to an upper face (a face of an upper side) of the drain electrode 54. In addition, the pixel electrode 55 is formed on the substantially entire face of the drain electrode 54. The pixel electrode 55 extends from the upper face of the drain electrode 54 into the pixel 50, so that it is formed on the substantially whole face of the area surrounded by the source wiring 44 and the gate wiring 43 configuring the pixel 50, as shown in FIGS. 3 and 4. In other words, the pixel electrode 55 is provided so that a part thereof overlaps with the drain electrode 54. At this time, the pixel electrode 55 is overlapped so that a pattern end portion of the channel area side of the pixel electrode 55 is arranged at the substantially same position as the pattern end portion of the channel area side of the drain electrode 54 or is slightly retreated from the pattern end portion of the drain electrode 54. Accordingly, the pattern end face of the channel area side of the drain electrode 54 is not covered by the pixel electrode 55. The pixel electrode 55 is formed to cover the pattern end face of the drain electrode 54 except for the channel area, for example. In the meantime, the pixel electrode 55 is a transparent conductive film pattern formed of a transparent conductive film such as ITO. Like this, the pixel electrode 55 is directly overlapped with the upper layer of the drain electrode 54 without sandwiching the insulation film. By this configuration, it is not necessary to provide a contact hole for electrically connecting the pixel electrode 55 to the drain electrode 54. It is possible to secure the electrical connection between the pixel electrode and the drain electrode by directly overlapping a part of the pixel electrode 55 with the drain electrode 54. Accordingly, it is possible to form the pixel electrode 50 without providing an area for arranging a contact hole with respect to the connection between the drain electrode 54 and the pixel electrode 55 and to thus increase the opening rate.

In the above descriptions, the transparent conductive film pattern in the part directly overlapping with the drain electrode 54 and the transparent conductive film pattern formed on the substantially entire face of the area surrounded by the source wiring 44 and the gate wiring 43 are integrally formed, so that they are collectively referred to as the pixel electrode 55. However, since the latter transparent conductive film pattern substantially functions as the pixel electrode 55, the former transparent conductive film pattern may be distinguished from the pixel electrode 55, as a first transparent conductive film pattern 6 formed at the same layer by the transparent conductive film that is the same material as the pixel electrode 55. Furthermore, since the latter transparent conductive film pattern functioning as the pixel electrode 55 may be also interpreted as a first transparent conductive film pattern 6 formed at the same layer by the transparent conductive film that is the same material as the pixel electrode 55, considering the adjacent pixel electrode 55 as the subject, the entire pixel electrode 55 may be interpreted as the first transparent conductive film 6 without the particular distinction. Also, the configuration of covering the pattern end face in the above descriptions means that a film formed at the upper layer or a pattern configured by the film covers a face and an end face of the lower layer without discriminating the same. The configuration of covering also includes a state in which an end face of the lower layer pattern has a convex concave shape, for example, so that a film formed at the upper layer is not sufficiently contacted to the end face of the lower layer pattern, so-called a poor coverage state. To the contrary, the configuration of covering does not includes a state in which the pattern end face thereof is intentionally exposed by subsequent processing with the upper layer film being covering the end face of the lower layer pattern. In the below descriptions, the same meanings are applied in the specification.

In the first illustrative embodiment, the first transparent conductive film pattern 6 formed at the same layer by the transparent conductive film made of the same material as the pixel electrode 55 is directly overlapped on the substantially entire faces of the source electrode 53 and the source wiring 44. The first transparent conductive film pattern 6 is formed to cover the source electrode 53 and the source wiring 44, for example. At this time, like the structure of the drain electrode 54, the first transparent conductive film pattern is overlapped so that a pattern end portion of the channel area side of the first transparent conductive film pattern 6 is arranged at the substantially same position as the pattern end portion of the channel area side of the source electrode 53 or is slightly retreated from the pattern end portion of the source electrode 53. Hence, the pattern end portion of the channel area side of the source electrode 53 is not also covered by the first transparent conductive film pattern 6. In addition, the first transparent conductive film pattern 6 provided on the source electrode 53 is spaced from the pixel electrode 55. Also, the first transparent conductive film pattern 6 provided on the source electrode 53 and the pixel electrode 55 are not provided above the channel area of the semiconductor layer 3. Additionally, as shown in the sectional view of FIG. 4, the pattern of the source wiring 44 part is configured by the source wiring 44, which is made of the metal pattern formed at the same layer by the same material as the source electrode 53, and the semiconductor layer 3 formed on the substantially entire face below the source wiring 44. The ohmic contact film 4 is formed between the source wiring 44 and the semiconductor layer 3. The first transparent conductive film pattern 6 is formed above the source wiring 44, the ohmic contact film 4 and the semiconductor layer 3 to stick out from the inside of the pattern of the source wiring 44, thereby covering the pattern end face of the source wiring 44. In the sectional view of FIG. 4, only one end face of the source wiring 44 (left end face in FIGS. 3 and 4) is shown. However, also in the other end face, the same first transparent conductive film pattern 6 sticks out from the inside of the pattern of the source wiring 44, thereby covering the pattern end face of the source wiring 44. The source wiring 44, the semiconductor layer 3 arranged to overlap with the source wiring 44, the layer configuration of the first transparent conductive film pattern 6 and the position relation of the pattern end portions are common except for the outermost periphery pixel 50 of the display area 41 and the periphery thereof. Since the source wiring 44 are repeatedly arranged, the wiring is referred to as an arrangement wiring pattern 59a.

Like this, in the first illustrative embodiment, the first transparent conductive film pattern 6 is stacked on the source electrode 53, the drain electrode 54 and the source wiring 44 made of a second conductive film 5. Here, the first transparent conductive film pattern 6 is formed to completely cover all areas of the pattern formed of the second conductive film 5, except for the channel area of the TFT 51. Thereby, the source wiring 44 for supplying a display signal to the respective pixels 50 can be configured by the stack structure of the second conductive film 5 and the first transparent conductive film pattern 6. Accordingly, it is possible to suppress the source wiring 44 from being disconnected. In other words, like the semiconductor layer 3 below the source wiring 44, the first transparent conductive film pattern 6 deposited on the source wiring 44 can be used as a redundant wiring of the source wiring 44. Hence, even when the source wiring 44 is disconnected, it is possible to suppress the interruption of an electric signal.

A second insulation film 9 is provided as an upper layer insulation film that covers the pixel electrode 55 and the first transparent conductive film pattern 6. The second insulation film 9 covers the TFT 51 and functions as a protective film of the TFT 51. The second insulation film is formed by an insulation film of silicon nitride, silicon oxide and the like, a coated insulation film (which is formed by coating) or a stacked film thereof. In the first illustrative embodiment, an opposite electrode 56 is formed on the second insulation film 9. The opposite electrode 56 is provided on an opposite face to the pixel electrode 55 with sandwiching the second insulation film 9 and has a slit for generating an electric field between the opposite electrode 56 and the pixel electrode 55. As shown in FIG. 3, a plurality of the slits is provided in substantially parallel with the source wiring 44. The slit is linearly provided in a direction of intersecting with the gate wiring 43, for example. To the contrary, a plurality of comb-shape electrodes is formed between the slits, and thus it can be said that the opposite electrode 56 is configured by the comb-shape electrodes. By the configurations of the pixel electrode 55 and the opposite electrode 56, the fringe electric field is generated to drive the liquid crystals, so that the liquid crystal display apparatus of the FFS mode can be configured.

In the meantime, since the opposite electrode 56 and the pixel electrode 55 are insulated by the second insulation film 9, the second insulation film 9 also functions as an interlayer insulation film. In addition, the opposite electrode 56 is electrically connected to the common wiring 52 through a contact hole CH1 that is an opening penetrating the second insulation film 9 and the first insulation film 8. Also, the opposite electrode 56 is integrally formed so that it is connected to the opposite electrode 56 of the adjacent pixels 50 with sandwiching the gate wiring 43. Specifically, the opposite electrodes 56 of the pixels 50 that are adjacent with sandwiching the gate wiring 43 are coupled by an opposite electrode connection 57. Here, the opposite electrode connection 57 of the opposite electrodes 56 is formed to cross over the gate wiring 43 in the area that does not overlap with the source wiring 44 or TFT 51. In other words, the opposite electrode 56 is formed to overlap with at least a part of the gate wiring 43. The opposite electrode 56 and the opposite electrode connection 57 are transparent conductive film patters that are integrally formed by a transparent conductive film such as ITO.

Figure 6A:
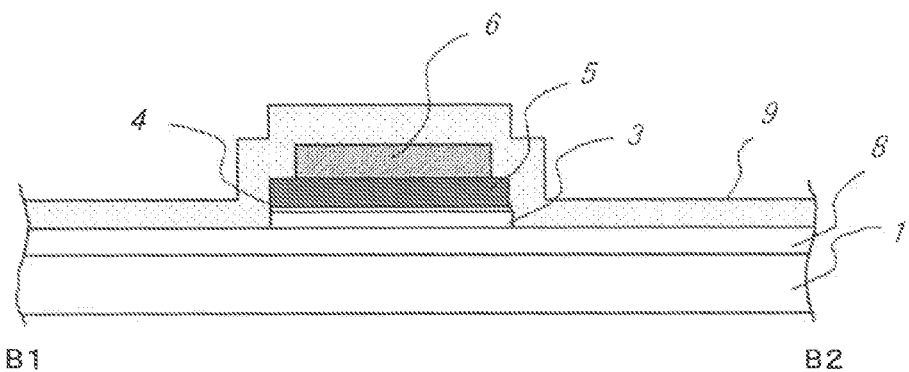
FIGS. 6A and 6B are sectional views illustrating the wiring conversion part of the TFT array substrate according to the first illustrative embodiment of the present invention.
Figure 6B:
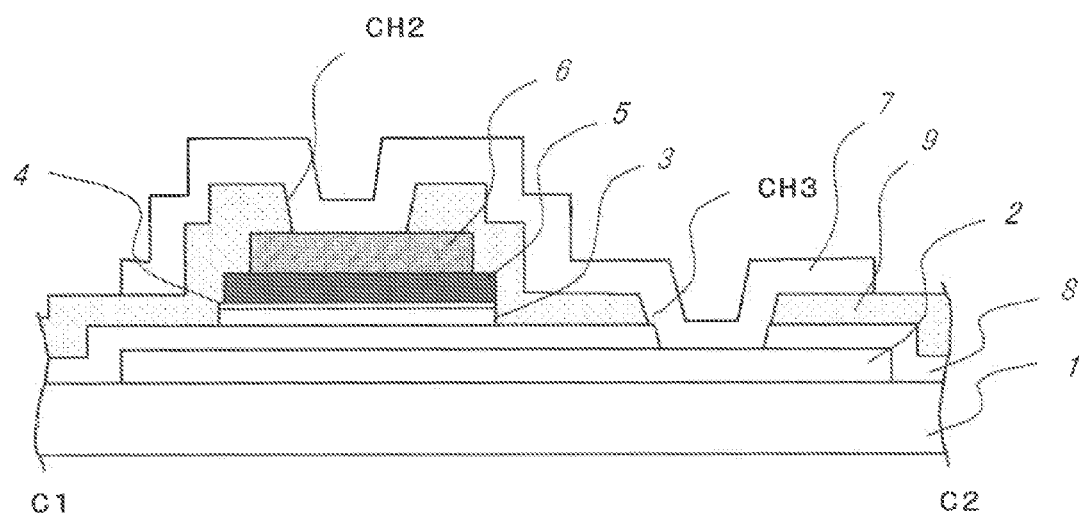

In the below, a configuration of the wiring conversion part 45 of the liquid crystal display apparatus according to the first illustrative embodiment is described with reference to FIGS. 5, 6A, and 6B. FIG. 5 is a plan view illustrating the wiring conversion part 45 that is arranged in the frame area 42 of the TFT array substrate 100 according to the first illustrative embodiment. FIG. 6A is a sectional view taken along a line B1-B2 of FIG. 5 and FIG. 6B is a sectional view taken along a line C1-C2 of FIG. 5. As shown in FIG. 5, regarding areas divided by the dotted line, the upper side is the frame area 42 and the lower side is the display area 41. The leader wiring 47b1, which is connected to the display signal driving circuit 46b, the external wiring 49b and the like, is led from the upper side of the frame area 42 to the wiring conversion part 45 by the first conductive film 2 formed at the same layer by the same material as the gate wiring 43. The extension part of the source wiring 44 in the display area 41 is led from the lower side of the display area 41 to the wiring conversion part 45 by the stack pattern having the same layer configuration as the source wiring 44.

First, the specific layer configuration of the extension part of the source wiring 44 is described with reference to the plan view of FIG. 5 and FIG. 6A illustrating a sectional view taken along a line B1-B2. As shown in FIG. 6A, the first insulation film 8 is provided on the substrate 1. In the meantime, the first insulation film 8 is commonly formed to the gate insulation film of the TFT 51 in the display area 41 by the insulation film such as silicon nitride and the like. Thus, in the specification, the first insulation film 8 formed in the frame area 42 is also interpreted as the same insulation film as the gate insulation film, without distinction, so that it may be referred to as the gate insulation film. In addition, the stacked film of the semiconductor film 3 and the ohmic contact film 4, which are formed at the same layers by the same materials as the semiconductor film 4 and the ohmic contact film 4 in the display area 41 used for the TFT 51, is formed at the upper layer of the first insulation film 8. And the second conductive film 5 is formed on the ohmic contact film 4 as an upper layer to directly contact the ohmic contact film 4. The second conductive film 5 is also a metal pattern formed at the same layer by the same material as the second conductive film 5, which is configuring the source electrode 53, the drain electrode 54 and the source wiring 44 in the display area 41 used for the TFT 51. In addition, the second conductive film 5 is arranged to overlap with the ohmic contact film 4 and pattern end portions of the second conductive film 5 are overlapped so that they are arranged at the substantially same positions of the pattern end portions of the ohmic contact film 4. Accordingly, in the plan view of FIG. 5, the outward shape of the pattern of the semiconductor film 3 and the ohmic contact film 4 is shown to overlap with the pattern outward shape of the second conductive film 5.

In addition, the first transparent conductive film pattern 6 is formed on the second conductive film 5 as an upper layer to directly contact the second conductive film 5. The first transparent conductive film pattern 6 is formed at the same layer by the same material as the transparent conductive film pattern configuring the pixel electrode 55 of the display area 41. Also, as shown in FIG. 6A, both end faces of the first transparent conductive film pattern 6 are retreated more inwards than both end faces of the pattern of the second conductive film 5. In other words, as can be seen from the plan view of FIG. 5, the end faces of the first transparent conductive film pattern 6 are arranged at the more inner sides than the end faces of the pattern of the second conductive film 5, and the first transparent conductive film pattern 6 having a width slightly narrower than the pattern of the second conductive film 5 is overlapped along the inner sides of the pattern of the second conductive film 5. Also, as can be clearly seen from the sectional view of FIG. 6A, the pattern end faces of the semiconductor layer 3, the ohmic contact film 4 and the second conductive film 5 are not covered by the first transparent conductive film pattern 6. In the other words, the first transparent conductive film pattern 6 is formed to not cover the pattern end faces of the semiconductor layer 3, the ohmic contact film 4 and the second conductive film 5. In addition, the second insulation film 9 is formed at the upper layer of the first transparent conductive film pattern 6. The second insulation film 9 is formed to cover the first insulation film 8, the semiconductor film 3, the ohmic contact film 4, the second conductive film 5 and the first transparent conductive film pattern 6, or to cover the gate insulation film of the TFT 51. The second insulation film 9 is formed to directly cover the end faces of the semiconductor film 3, the ohmic contact film 4, the second conductive film 5 and the first transparent conductive film pattern 6.

In the below, it will be described that the specific layer structure of the structure of connecting and converting between the wirings from the extension part of the source wiring 44 to the leader wiring 47b1 by using two contact holes, with reference to the plan view of FIG. 5 and FIG. 6B illustrating a sectional view taken along a line C1-C2. In the sectional part of the wiring conversion part 45 taken along the line C1-C2, as shown in FIG. 6B, the first conductive film 2, which is formed at the same layer by the same material as the gate electrode and the gate wiring 43 of the TFT 51 in the display area 41 and extends from the frame area 42, is formed on the substrate 1. The first insulation film 8 common to the B1-B2 section of FIG. 5 is provided to cover the first conductive film 2. At the upper layer of the first insulation film 8, the semiconductor film 3, the ohmic contact film 4, the second conductive film 5 and the first transparent conductive film pattern 6 are formed with the layer structure common to the B1-B2 section of FIG. 5. More specifically, as shown in the sectional view of FIG. 6B, the end faces of the first transparent conductive film pattern 6 are retreated more inwards than the end faces of the pattern of the second conductive film 5. In other words, as can be seen from the plan view of FIG. 5, the end faces of the first transparent conductive film pattern 6 are arranged at the more inner side than the end faces of the pattern of the second conductive film 5 and the first transparent conductive film pattern 6 of the slightly narrower area is overlapped along the inner side of the pattern of the second conductive film 5. In other words, including the wiring conversion part 45 of the B1-B2 section, the first transparent conductive film pattern 6 is located within the pattern of the second conductive film 5, as viewed from the top side. That is, as can be clearly seen from the structure in which the first transparent conductive film pattern 6 is located within the pattern of the second conductive film 5, as viewed from the top side, the first transparent conductive film pattern 6 is formed to not cover the pattern end faces of the semiconductor layer 3, the ohmic contact film 4 and the second conductive film 5.

In addition, like the B1-B2 section of FIG. 5, the second insulation film 9 is formed to cover the first insulation film 8, the semiconductor film 3, the ohmic contact film 4, the second conductive film 5 and the first transparent conductive film pattern 6, or to cover the TFT 51. The second insulation film 9 is formed to directly cover the end faces of the semiconductor film 3, the ohmic contact film 4, the second conductive film 5 and the first transparent conductive film pattern 6. In the C1-C2 section of FIG. 5, a part of the second insulation film 9 is formed with a contact hole CH2, which is formed by an opening in the second insulation film 9 above the first transparent conductive film pattern 6 and exposes the first transparent conductive film pattern 6. A part of the second insulation film 9 and a part of the first insulation film 8 are formed with a contact hole CH3, which is formed by penetrating the first insulation film 8 and the second insulation film 9 above the first conductive film 2 and exposes the first conductive film 2. Also, a second transparent conductive film pattern 7, which is an upper layer transparent conductive film pattern made of the other transparent conductive film provided at an upper layer above the first transparent conductive film pattern 6, is formed in a pattern to cover the contact hole CH2, the contact hole CH3 and the second conductive film 5 and to extend between the contact hole CH2 and the contact hole CH3. The second transparent conductive film pattern 7 is electrically connected to the first transparent conductive film pattern 6 and the second conductive film 5 through the contact hole CH2 and is connected to the first conductive film 2 through the contact hole CH3. As a result, the first conductive film 2 and the second conductive film 5 are electrically connected to each other via the second transparent conductive film pattern 7. In the meantime, the second transparent conductive film pattern 7 is formed at the same layer by the same material as the transparent conductive film pattern configuring the opposite electrode 56 of the display area 41.

In addition, the second transparent conductive film pattern 7 is formed to cover the contact hole CH2 and the more outer side than the pattern of the second conductive film 5, as viewed from the top side above the second insulation film 9. Accordingly, since the pattern end portions of the second transparent conductive film pattern 7 are formed at the more outer side than the pattern end portions of the second conductive film 5, even when the wiring conversion part 45 is exposed to the outside air, the second conductive film 5 is protected by the second insulation film 9 and the second transparent conductive film pattern 7, so that it is possible to reduce the corrosion of the second conductive film 5. In particular, since the pattern end faces of the second conductive film 5 are not covered by the first transparent conductive film pattern 6 and thus are not protected, the second transparent conductive film pattern 7 is preferably formed to cover at least the pattern end faces of the second conductive film 5 that are not covered by the first transparent conductive film pattern 6. Regarding the wiring conversion part 45 of the first illustrative embodiment shown in FIG. 5, the second transparent conductive film pattern 7 is formed to cover the pattern end faces of the second conductive film 5 only in the wiring conversion part 45. However, the second transparent conductive film pattern 7 may be formed to cover the pattern end faces of the second conductive film 5, which are not covered by the first transparent conductive film pattern 6, within the range of the B1-B2 section, the source wiring 44 or at least the frame area 42 that is exposed to the outside air in many cases, which is preferable from a standpoint of corrosion reduction.

Also, although the second transparent conductive film pattern 7 is formed to cover the second conductive film 5, it may also cover the first conductive film 2. By covering the first conductive film 2, the first conductive film 2 is protected by the first insulation film 8, the second insulation film 9 and the second transparent conductive film pattern 7, so that it is also possible to reduce the corrosion of the first conductive film 2. In the meantime, when the second conductive film 5 cannot be covered entirely or partially by the second transparent conductive film pattern 7 due to the margin design between the wirings, it is preferable to appropriately take measures of suppressing the corrosion by the other means such as coating of moisture resistance film, at least within the range of the frame area 42 that is exposed to the outside air in many cases.

In the meantime, regarding the wiring conversion part 45 having the two-layered transparent conductive film patterns of the first transparent conductive film pattern 6 and the second transparent conductive film pattern 7 in the first illustrative embodiment, since the liquid crystal display apparatus of the first illustrative embodiment is the liquid crystal display apparatus of the FFS mode having the pixel electrode 55 and opposite electrode 56 configured by the two-layered transparent conductive film patterns, it is possible to configure the first transparent conductive film pattern 6 and the pixel electrode 55 at the same layer by the same material and the second transparent conductive film pattern 7 and the opposite electrode 56 at the same layer by the same material, respectively, so that it is possible to configure the wiring conversion part 45 without increasing the process of forming the transparent conductive film and the fine processing process of the transparent conductive film.

In addition, the first transparent conductive film pattern 6 is located within the pattern of the second conductive film 5, as viewed from the top side. There is the effects of the semiconductor film 3, the ohmic contact film 4 and the second conductive film 5 formed below the first transparent conductive film pattern 6, specifically the effect resulting from that the pattern end portion of the first transparent conductive film pattern 6 is formed without contacting the first insulation film 8 at the end portion of the wiring conversion part 45 sandwiched between the first insulation film 8, which is also the gate insulation film of the TFT 51, and the second insulation film 9.

According to the wiring conversion part 45 formed to not cover the pattern end faces of the second conductive film 5, it is possible to avoid the stress concentration on the pattern end faces of the first transparent conductive film pattern 6 after the formation of the second insulation film 6. Therefore, the second insulation film 9 is hardly peeled off. Thus, it is possible to suppress the lowering of the yield rate due to the delamination of the second insulation film 9 and the like and is possible to improve the yield rate. Furthermore, with respect to the film formation conditions of the second insulation film 9, it is possible to arbitrarily select the film formation conditions, such as the film formation condition of improving the transmittance of the first transparent conductive film pattern 6, the film formation condition of forming a favorable contact end face shape on the face of the first transparent conductive film pattern 6 when forming an opening in the second insulation film 9 and the like, the conditions of which may promote the delamination. Therefore, it is possible to improve the manufacturing margin of the device and to suppress the lowering of the yield rate due to the delamination and the like at the same time.

Figure 7A:
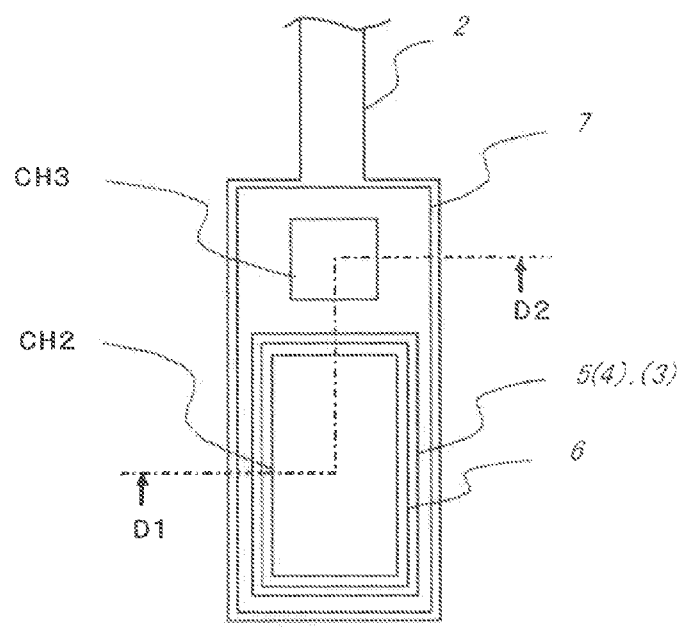
FIG. 7A is a plan view and FIG. 7B is a sectional view, the views illustrating an external connection terminal of the TFT array substrate according to the first illustrative embodiment of the present invention.
Figure 7B:
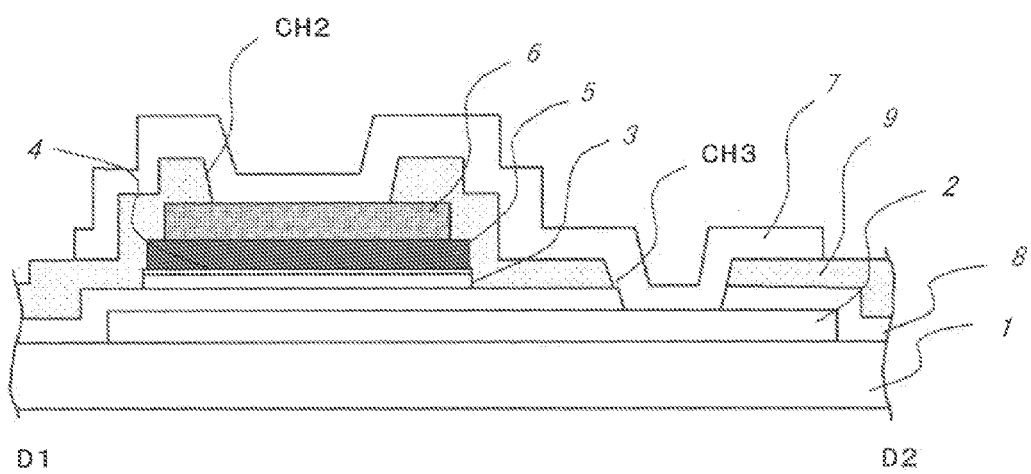
Figure 8A:
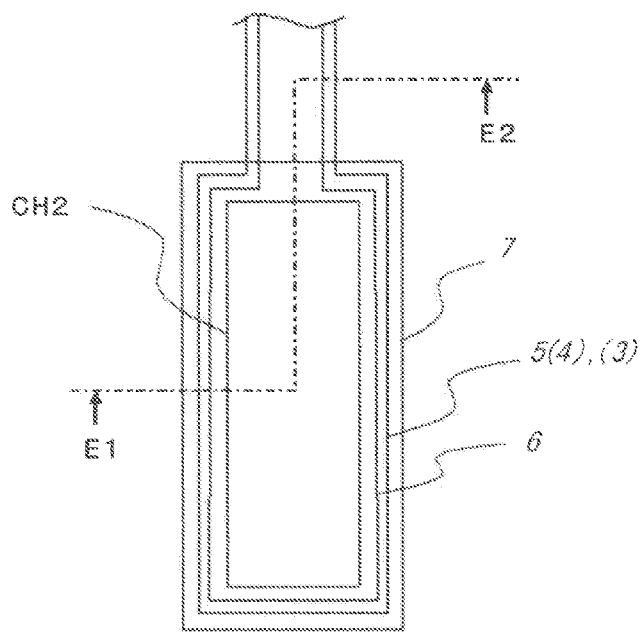
FIG. 8A is a plan view and FIG. 8B is a sectional view, the views illustrating the external connection terminal of the TFT array substrate according to the first illustrative embodiment of the present invention.
Figure 8B:
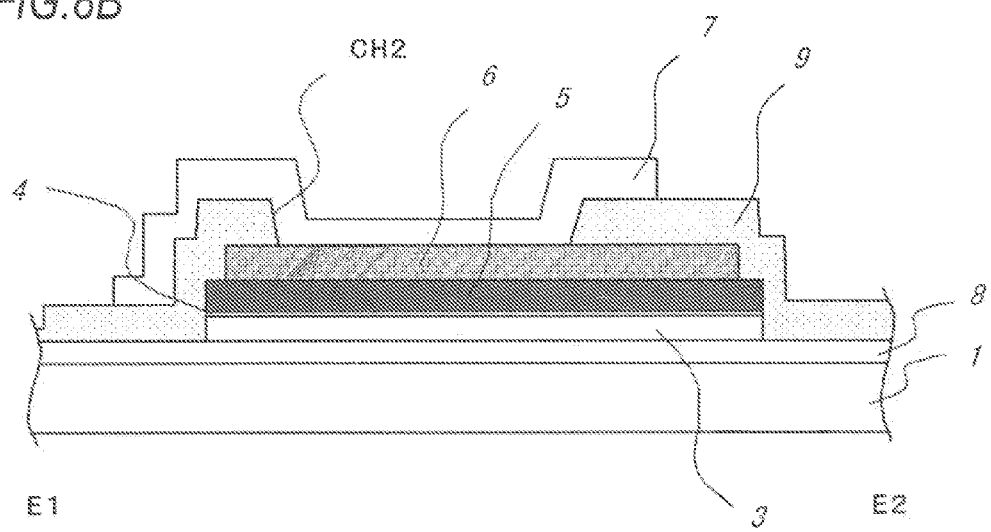

In the above descriptions, the wiring conversion part 45 has been exemplified. However, the external connection terminal may be exemplified as a part having the similar structure to the wiring conversion part 45 in the frame area 42. Even when the present invention is applied to the structure of the external connection terminal, it is possible to obtain the very suitable effects, like the wiring conversion part 45. In the below, an example in which the present invention is applied to the external connection terminal of the liquid crystal display apparatus according to the first illustrative embodiment is described with reference to FIGS. 7A, 7B, 8A, and 8B, with considering the differences from the wiring conversion part 45. FIGS. 7A, 7B, 8A, and 8B illustrates the external connection terminal that is arranged in the frame area 42 of the TFT array substrate 100 according to the first illustrative embodiment. FIGS. 7A and 7B show the external connection terminal configuration that is led to the external connection terminal by the first conductive film 2 formed at the same layer by the same material as the gate wiring 43, and FIGS. 8A and 8B shows the external connection terminal configuration that is led to the external connection terminal by the stack pattern of the same layer configuration as the source wiring 44. FIGS. 7A and 8A are plan views illustrating around the external connection terminal, FIG. 7B is a sectional view taken along a line D1-D2 of FIG. 7A and FIG. 8B is a sectional view taken along a line E1-E2 of FIG. 8A.

First, as shown in FIGS. 7A and 7B, the first conductive film 2, which is formed at the same layer by the same material as the gate wiring 43 led to the external connection terminal, is formed on the substrate 1, like the wiring conversion part 45. The other configurations are the substantially same as the sectional view of FIG. 6B and the detailed descriptions thereof will be omitted. However, in the configuration of the external connection terminal of FIGS. 7A and 7B, the main function of the second transparent conductive film pattern 7 of the wiring conversion part 45 is different from a main function of the second transparent conductive film pattern 7, which covers the contact hole CH2 formed on the first transparent conductive film pattern 6, the contact hole CH3 formed on the first conductive film 2 and the second conductive film 5 and is formed to extend between the contact hole CH2 and the contact hole CH3, of the external connection terminal.

Specifically, the function of electrically connecting the first conductive film 2 and the second conductive film 5 of the second transparent conductive film pattern 7 is not important, and the main function of the second transparent conductive film pattern 7 is to serve as a terminal electrode that is electrically connected to the first conductive film 2 through the contact hole CH3. However, the layer configuration is the substantially same and the planar structure thereof is such a structure that the first transparent conductive film pattern 6 is located within the second conductive film 5, as viewed from the top side, so that the first transparent conductive film pattern 6 is formed to not cover the pattern end faces of the semiconductor layer 3, the ohmic contact film 4 and the second conductive film 5. Accordingly, like the wiring conversion part 45, it is possible to suppress the lowering of the yield rate due to the delamination of the second insulation film 9 and the like and is possible to improve the yield rate. In addition, the second transparent conductive film pattern 7 is formed to cover the contact hole CH2 and the more outer side than the pattern of the second conductive film 5, above the second insulation film 9, as viewed from the top side. Accordingly, it is possible to realize the corrosion-reduction effect, like the wiring conversion part 45. In particular, for the structure of the external connection terminal shown in FIG. 7, the pattern of the second conductive film 5 is formed only at the external connection terminal and the second transparent conductive film pattern 7 is formed to cover the more outer side than all end faces of the pattern of the second conductive film 5. Accordingly, it is possible to realize the higher corrosion-reduction effect, compared to the wiring conversion part 45 shown in FIG. 5.

In addition, as shown in FIGS. 8A and 8B, the stack pattern having the same layer configuration as the source wiring 44 led to the external connection terminal is formed on the substrate 1, like the wiring conversion part 45. Specifically, as the same fashion to the sectional view of FIG. 6A illustrating the wiring conversion part 45, the first insulation film 8 is provided on the substrate 1, and the stacked film, in which the semiconductor film 3, the ohmic contact film 4 and the second conductive film 5 are sequentially stacked, is formed, and then the second conductive film 5 is arranged to overlap with the ohmic contact film 4. In the meantime, the pattern end portions of the second conductive film 5 are overlapped so that they are arranged at the substantially same positions as the pattern end portions of the ohmic contact film 4. Furthermore, the first transparent conductive film pattern 6 is formed at the upper layer of the second conductive film 5 to directly contact to the second conductive film 5, the end faces of the first transparent conductive film pattern 6 are arranged at the more inner side than the end faces of the pattern of the second conductive film 5 and the first transparent conductive film pattern 6, which has the width slightly narrower than the pattern of the second conductive film 5, is overlapped along the inner side of the pattern of the second conductive film 5. In addition, the second insulation film 9 is formed to cover the first insulation film 8, the semiconductor film 3, the ohmic contact film 4, the second conductive film 5 and the first transparent conductive film pattern 6, or to cover the gate insulation film of the TFT 51. The second insulation film 9 is formed to directly cover the end faces of the semiconductor film 3, the ohmic contact film 4, the second conductive film 5 and the first transparent conductive film pattern 6. Also in the configuration of FIGS. 8A and 8B, like the configuration of FIGS. 7A and 7B, a part of the second insulation film 9 is formed with the contact hole CH2, which is formed by an opening in the second insulation film 9 above the first transparent conductive film pattern 6 and exposes the first transparent conductive film pattern 6. The second transparent conductive film pattern 7 is formed to cover from the contact hole CH2 to the more outer side than the pattern of the second conductive film 5 above the second insulation film 9, as viewed from the top side.

Accordingly, also in the configuration of the external connection terminal of FIGS. 8A and 8B, the first transparent conductive film pattern 6 is located within the pattern of the second conductive film 5, as viewed from the top side, so that the first transparent conductive film pattern 6 is formed to not cover the pattern end faces of the semiconductor layer 3, the ohmic contact film 4 and the second conductive film 5. The first transparent conductive film pattern 6 has the same structure as the wiring conversion part 45. Hence, like the wiring conversion part 45, regarding the delamination of the second insulation film 9, which is easy to occur as the second insulation film is arranged in an area of the frame area 42 in which a pattern density is relatively low, it is possible to suppress the lowering of the yield rate due to the delamination by the same configuration as the wiring conversion part 45 and is possible to improve the yield rate. Also, the second transparent conductive film pattern 7 is formed to cover from the contact hole CH2 to the more outer side than the pattern of the second conductive film 5 as viewed from the top side above the second insulation film 9. Accordingly, it is possible to realize the corrosion-reduction effect, like the wiring conversion part 45. Furthermore, as the common effect to the configurations of the external connection terminals shown in FIGS. 7A and 8, the configuration of the external connection terminal having the two-layered transparent conductive film patterns of the first transparent conductive film pattern 6 and the second transparent conductive film pattern 7 is provided to the liquid crystal display apparatus of the FFS mode, like the wiring conversion part 45, so that it is possible to realize the configuration without increasing the process of forming the transparent conductive film and the fine processing process of the transparent conductive film.

In the above, the pattern position relation of the second conductive film 5 of the wiring conversion part 45 and the external connection terminal and the first transparent conductive film pattern 6 provided thereon has been described. However, the wiring in the frame area 42 of the TFT array substrate 100 or the wiring of the outermost periphery pixel 50 and the periphery part thereof are also formed in the frame area 42 and are the areas having the relatively low pattern density in which the pixel electrode 55 is not arranged between the wirings or at the further more outer side than the outermost periphery pixel 50, unlike the structure in the display area 41. Accordingly, the delamination of the second insulation film 9 is easy to occur in the area, like the external connection terminal or wiring conversion part 45. Hence, with respect to the wiring in the frame area 42 of the TFT array substrate 100 or the wiring of the outermost periphery pixel 50 and the periphery part thereof, it is possible to suppress the delamination by making the pattern position relation of the second conductive film 5 and the first transparent conductive film pattern 6 provided thereon same as the external connection terminal or wiring conversion part 45. In the below, the detailed configuration of the outermost periphery pixel 50 and the periphery part thereof in the display area 41 of the liquid crystal display apparatus according to the first illustrative embodiment is described with reference to FIGS. 9, 10, 11A and 11B.

Figure 10:
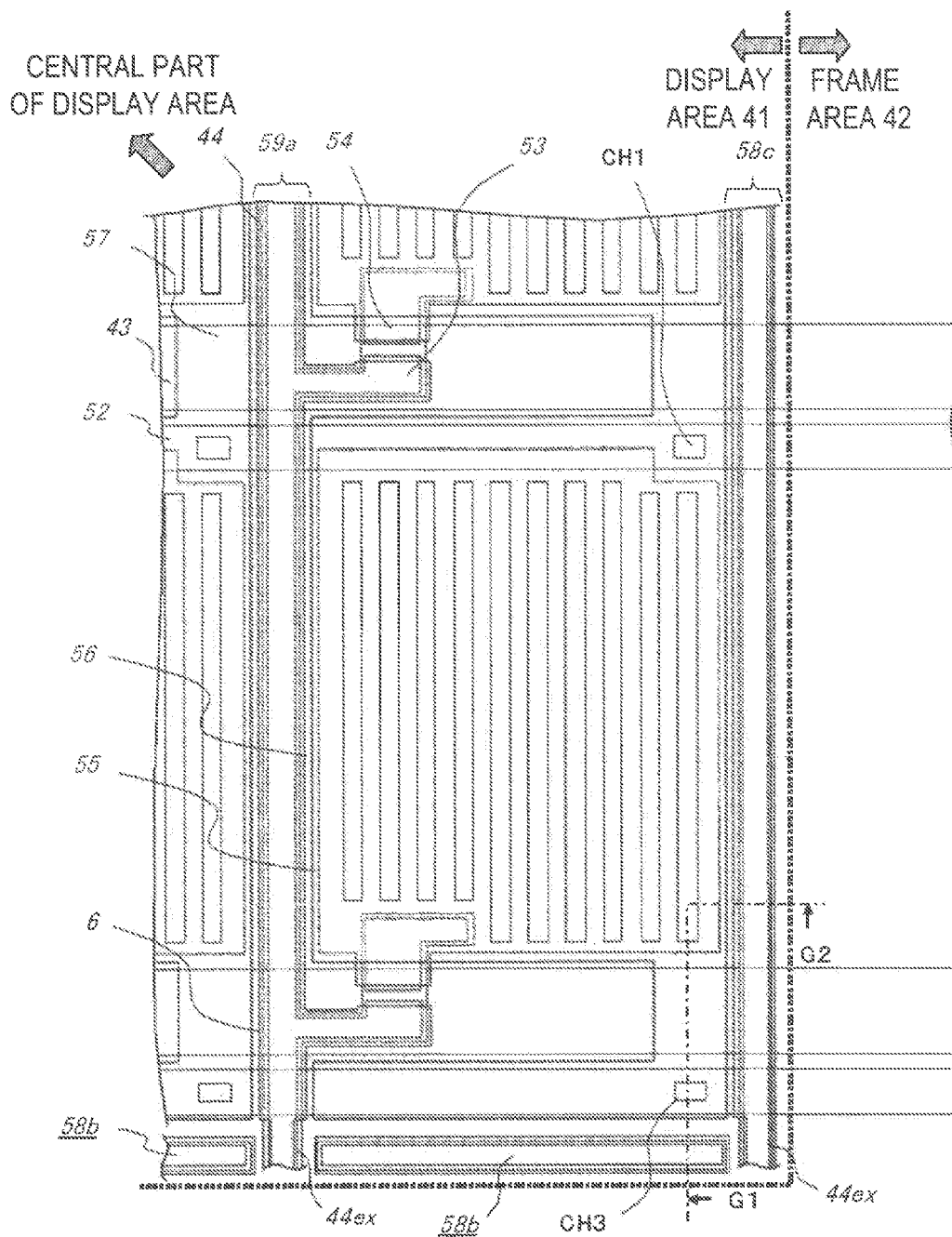
FIG. 10 is a plan view illustrating the outermost periphery display area of the TFT array substrate according to the first illustrative embodiment of the present invention.
Figure 11A:
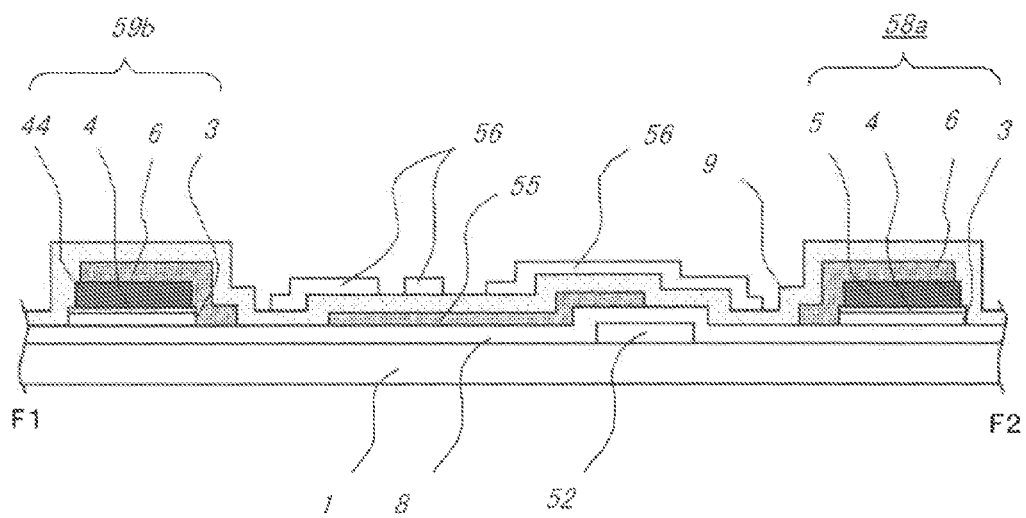
FIGS. 11A and 11B are sectional views illustrating the outermost periphery display area of the TFT array substrate according to the first illustrative embodiment of the present invention.
Figure 11B:
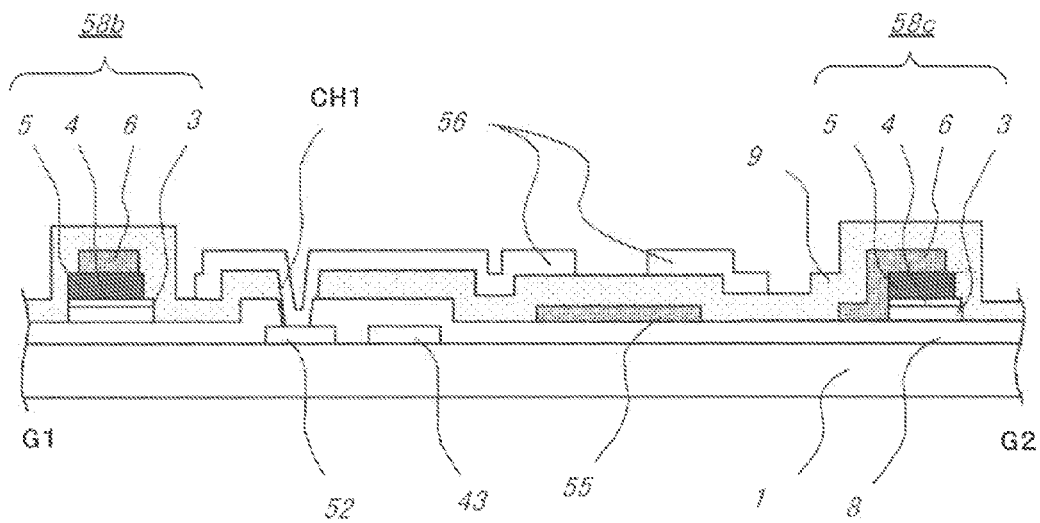

FIGS. 9 and 10 are plan views illustrating the outermost periphery pixel 50 and the periphery part thereof in the display area 41 of the liquid crystal display apparatus according to the first illustrative embodiment, FIG. 11A is a sectional view taken along a line F1-F2 of FIG. 9 and FIG. 11B is a sectional view taken along a line G1-G2 of FIG. 10.

As shown in FIG. 9 in which a direction of a center the display area 41 is indicated with a right-lower directed arrow, FIG. 9 shows the outermost periphery pixel 50 and the periphery part thereof at the corner of the left-upper side with respect to the central part of the display area 41. As shown in FIG. 10 in which the center direction of the display area 41 is indicated with a left-upper directed arrow, FIG. 10 shows the outermost periphery pixel 50 and the periphery part thereof at the corner of the right-lower side with respect to the central part of the display area 41. Specifically, in FIGS. 9 and 10, the different points from the pixel configuration near the central part of the display area 41 described above will be described in detail.

First, with reference to the plan view of FIG. 9 and the sectional view of FIG. 11A, the different points from FIG. 3 will be described. In FIG. 9, the pattern configuration of the pixel 50 at the outermost periphery of the display area 41, specifically the pattern configuration configuring the source wiring 44 formed at the outermost periphery of the display area 41 is referred to as an outermost wiring pattern 59b, in order to distinguish the arrangement wiring pattern 59a that is the pattern configuration in the area except for the outermost periphery pixel 50 and the periphery part thereof described above. In the outermost wiring pattern 59b, as shown in the sectional view of FIG. 11A, at least the pattern end face near the outer side of the display area of the first transparent conductive film pattern 6 is formed at the inner side without sticking out from the pattern end portion of the second conductive film 5 configuring the source wiring 44. In other words, the pattern end faces near the outer side of the display area of the semiconductor layer 3, the ohmic contact film 4 and the second conductive film 5 are not covered by the first transparent conductive film pattern 6. To the contrary, regarding the pattern end face near the central part of the display area 41 of the second conductive film 5, the first transparent conductive film pattern 6 sticks out from the inside area of the pattern of the second conductive film 5 and thus covers the pattern end face of the second conductive film 5, like the configuration of the pattern end face of the adjacent arrangement wiring pattern 59a.

In addition, a source wiring extension part 44ex of the source wiring 44 in the display area 41 shown in the plan views of FIGS. 9 and 10, which extends toward the frame area 42, preferably has the same configuration as FIG. 6A that is the sectional view of the wiring conversion part 45 taken along the line B1-B2 of FIG. 5. In other words, the first transparent conductive film pattern 6 is formed so that it directly contacts the pattern of the second conductive film 5 configuring the source wiring extension part 44ex, the end face of the first transparent conductive film pattern 6 is arranged at the more inner side than the end face of the pattern of the second conductive film 5, and the first transparent conductive film pattern 6 having the slightly narrower area is overlapped along the inner side of the pattern of the second conductive film 5. In other words, the first transparent conductive film pattern 6 is located within the pattern of the second conductive film 5, as viewed from the top side. As a result, the first transparent conductive film pattern 6 is formed to not cover the pattern end faces of the semiconductor layer 3, the ohmic contact film 4 and the second conductive film 5.

In addition, for an outer end side of the pixel 50 at an outer edge of the display area in a direction perpendicular to the source wiring 44, the pattern and the like are not arranged near the end face of the first transparent conductive film pattern 6 (specifically, pixel electrode 55) sticking out from the pattern end portion of the second conductive film 5. Accordingly, the delamination due to the peeling off of the second insulation film 9 easy to occur near the end face of the first transparent conductive film pattern 6. Hence, as shown in FIG. 9, along the outer end side of the pixel 50 at the outer edge of the display area in the direction perpendicular to the source wiring 44, a dummy pattern 58a is arranged by the pattern having the same layer configuration as the outermost wiring pattern 59b configuring the source wiring 44 formed at the outermost periphery of the display area 41. By the dummy pattern 58a as an auxiliary pattern, the adhesive force of the second insulation film 9 is reinforced, so that it is possible to prevent or suppress the delamination due to the peeling off of the second insulation film 9. Since the dummy pattern 58a is formed by the same layer configuration as the outermost wiring pattern 59b, the delamination due to the peeling off of the second insulation film 9 is not caused at the more outer side than the dummy pattern 58a. Specifically, in the first illustrative embodiment, at the left-upper corner with respect to the central part of the display area 41 (refer to FIG. 9), the dummy pattern 58a is branched from the source wiring 44. Also, the same configuration of the dummy pattern 58a is arranged for all the pixels at the outer edge of the upper side of the display area. In addition, at the right-lower corner with respect to the central part of the display area 41 (refer to FIG. 10), a dummy pattern 58b having the same layer configuration as the outermost wiring pattern 59b, i.e., the same layer configuration as the dummy pattern 58a is arranged between the source wirings 44 by a pattern isolated from the source wirings 44. Likewise, the same configuration of the dummy pattern 58*b* is arranged for all the pixels at the outer edge of the lower side of the display area. In the meantime, the configuration of the dummy pattern 58*a* by the pattern branched from the source wiring 44 and the configuration of the dummy pattern 58*b* by the pattern isolated from the source wiring 44 may be interchanged at the upper and lower sides of the display area and may be unified into any one configuration.

In addition, as shown in FIG. 10, a dummy pattern 58*c* is formed at a side that does not contact the source wiring 44 of the pixel 50 at the outer edge of the display area. As shown in the sectional view of FIG. 11B, the dummy pattern 58*c* has the same configuration as the outermost wiring pattern 59*b*. Specifically, at least the pattern end face, which is near the outer side of the display area, of the first transparent conductive film pattern 6 is formed at the inner side of the pattern, without sticking out from the pattern end portion of the second conductive film 5 configuring the source wiring 44. In other words, the pattern end faces near the outer side of the display area of the semiconductor layer 3, the ohmic contact film 4 and the second conductive film 5 are not covered by the first transparent conductive film pattern 6. To the contrary, regarding the pattern end face near the central part of the display area 41 of the second conductive film 5, the first transparent conductive film pattern 6 sticks out from the inside area of the pattern of the second conductive film 5 and thus covers the pattern end face of the second conductive film 5, like the configuration of the pattern end face of the adjacent arrangement wiring pattern 59*a*.

Like this, the source wiring extension part 44*ex*, the outermost wiring pattern 58*b* and the dummy patterns 58*a* to 58*c*, which are the auxiliary patterns for reinforcing the adhesive force of the adjacent second insulation film 9, all of which having the different structures from the repeated structure of the inner side of the display area 41, are configured at the outer edges of the display area. Specifically, regarding the wirings or patterns at the outermost periphery pixels 50 and the periphery parts thereof in the display area 41 of the TFT array substrate 100, the pattern position relation of the second conductive film 5 and the first transparent conductive film pattern 6 provided thereof is made to be same as the wiring conversion part 45 that has been described in the above. As a result, it is possible to realize the same effect as the delamination suppressing effect near the wiring conversion part 45. Accordingly, it is possible to suppress the delamination of the second insulation film 9 by the pixel electrode 55, which is to be the structure of the first transparent conductive film pattern 6 sticking out from the pattern end portion of the second conductive film 5 of the pixel 50 at the outer edge of the display area, or the pattern end portions configuring the source wiring and source wiring extension part, so that it is possible to reduce the lowering of the yield rate due to the poor display, which is caused as the foreign substances are attached to the display area due to the delamination. In the meantime, when the first transparent conductive film pattern 6, which at least partially sticks out from the inside area of the pattern of the second conductive film 5 as viewed from the top side and covers the pattern end face of the second conductive film 5, is arranged, it suppress the delamination that may occur near the first transparent conductive film pattern 6 of the outermost periphery, specifically at the pattern end face sticking out from the second conductive film 5. Accordingly, the above effect can be realized by arranging the structures of the dummy patterns 58*a* to 58*c* near the first transparent conductive film pattern 6 of the outermost periphery, specifically at the pattern end face sticking out from the second conductive film 5. Furthermore, regarding the configuration of the dummy patterns 58*a* to 58*c* and the outermost wiring pattern 59*b*, the first transparent conductive film pattern 6 is formed to not cover the pattern end face of the second conductive film 5 at side of the pattern end face opposite to the side near the first transparent conductive film pattern 6, which is arranged near the outer side of the display area and formed with covering the pattern end face of the second conductive film 5. The structures of the dummy patterns 58*a* to 58*c* and the outermost wiring pattern 59*b* are favorable because the delamination is not further caused near the outer side of the display area. To the contrary, the configuration of the side near the first transparent conductive film pattern 6 arranged and formed as described above may cover the pattern end face of the second conductive film 5 or may not cover the same. In particular, when the near distance is close, there is little difference regarding the above effects.

In the first illustrative embodiment, the dummy patterns 58*a* to 58*c* are formed by the stacked film of the semiconductor layer 3, the ohmic contact film 4, the second conductive film 5 and the first transparent conductive film pattern 6. However, when the dummy patterns 58*a* to 58*c* are arranged near the end faces of the first transparent conductive film pattern 6 sticking out from the pattern end portion of the second conductive film 5, and when the dummy patterns 58*a* to 58*c* are formed below the second insulation film 9 causing the peeling off and thus can form a convex concave shape on the face of the first insulation film 8 to which the second insulation film 9 is contacted, it is possible to realize the effect of reinforcing the adhesive force of the second insulation film 9. Accordingly, the dummy patterns 58*a* to 58*c* may be formed of a single film or stacked film arranged below the second insulation film 9 being the upper layer insulation film. In any case, since the dummy patterns 58*a* to 58*c* are formed at the same layer by the same material as the film configuring the thin film transistor, it is possible to form the dummy patterns 58*a* to 58*c* without the additional film formation process or photolithography process for processing a film, so that it is possible to suppress the manufacturing cost from being increased.

In the below, a method for manufacturing the liquid crystal display apparatus of the first illustrative embodiment is described with reference to FIGS. 13A to 13C and 14A to 14C. FIGS. 13A to 13C and FIGS. 14*a* to 14C are sectional views illustrating manufacturing processes of the TFT array substrate 100 according to the first illustrative embodiment.

Figure 13A:
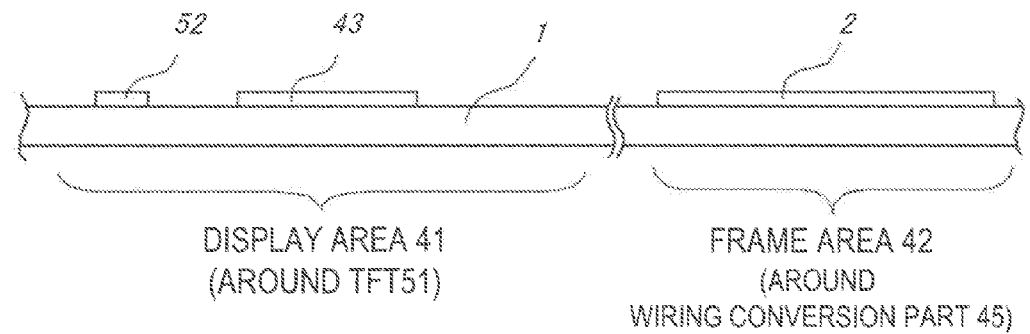
FIGS. 13A, 13B, and 13C are sectional views illustrating a method of manufacturing the TFT array substrate according to the first illustrative embodiment of the present invention.

First, a first conductive film 2 made of metal such as Cr, Al, Ta, Ti, Mo, W, Ni, Cu, Au or Ag, an alloy film having the metals as main components, or a stacked film thereof is formed on the whole face of a substrate 1 made of transparent insulating material such as glass. For example, the first conductive film is formed on the whole face of the substrate 1 by using a sputtering method or deposition method. Then, a resist is applied and the applied resist is exposed via a photo mask, so that the resist is sensitized. Then, the sensitized resist is developed and patterned, so that a resist pattern is formed. Hereinafter, the above series of processes are referred to as a photolithography process. Then, the etching is performed using the resist pattern as a mask, thereby removing the resist pattern. Hereinafter, a series of processes from the photolithography process are referred to as a fine processing process. Thereby, as shown in FIG. 13A, a metal pattern including a gate electrode, a gate wiring 43, a common wiring 52 and the first conductive film 2 formed at the same layer by the same material as the gate electrode is patterned. Like this, by the photolithography process or fine processing process, the gate electrode, the gate wiring 43 and the common wiring 52 are arranged in the display area 41 near the TFT 51 and the metal pattern the first conductive film 2 formed at the same layer by the same material as the gate electrode is arranged in the frame area 42 near a wiring conversion part 45.

Next, a first insulation film 8 to be a gate insulation film, a semiconductor layer 3 and an ohmic contact film 4 are sequentially formed so as to cover the metal pattern including the gate electrode, the gate wiring 43, the common wiring 52 and the first conductive film 2 formed at the same layer by the same material as the gate electrode. For example, the first insulation film, the semiconductor layer and ohmic contact film are formed on the whole face of the substrate 1 by using the plasma CVD, atmospheric pressure CVD, low pressure CVD and the like. Silicon nitride, silicon oxide and the like may be used as the first insulation film 8. In the meantime, the first insulation film 8 is preferably formed in several steps so as to suppress the short caused due to the film defect such as pinhole. Amorphous silicon, polycrystalline poly silicon and the like may be used as the first insulation film 8. The ohmic contact film 4 may be formed of n-type amorphous silicon or n-type polycrystalline silicon in which impurities of high concentration such as phosphorous (P) are added, for example. Continuously, in the first illustrative embodiment, a second conductive film made of metal such as Cr, Al, Ta, Ti, Mo, W, Ni, Cu, Au or Ag, an alloy film having the metals as main components, or a stacked film thereof is further formed on the ohmic contact film 4. For example, the second conductive film may be formed by the sputtering or deposition method.

Then, the second conductive film 5 is patterned by the photolithography process and the fine processing process. Thereby, a source wiring 44 and a part, which is branched from the source wiring 44 and is extending over the formation area of the TFT 51, are formed in the display area 41 by the second conductive film 5. The part branched from the source wiring 44 is formed to branch from the intersection of the source wiring 44 with the gate wiring 43 and to extend into the pixel 50. The part branched from the source wiring 44 is formed into a shape including a source electrode 53 and a drain electrode 54 that will be separated in a subsequent process. In other words, at this point of time, the second conductive film 5 remains above the channel area, and the source electrode 53 and the drain electrode 54 are connected. In other words, when the second conductive film 5 is patterned, it is formed that the source electrode 53 and the drain electrode 54 with being connected to each other on the semiconductor layer 3 to be the channel area of the TFT 51 and the source wiring 44 to be connected to the source electrode 53.

Figure 13B:
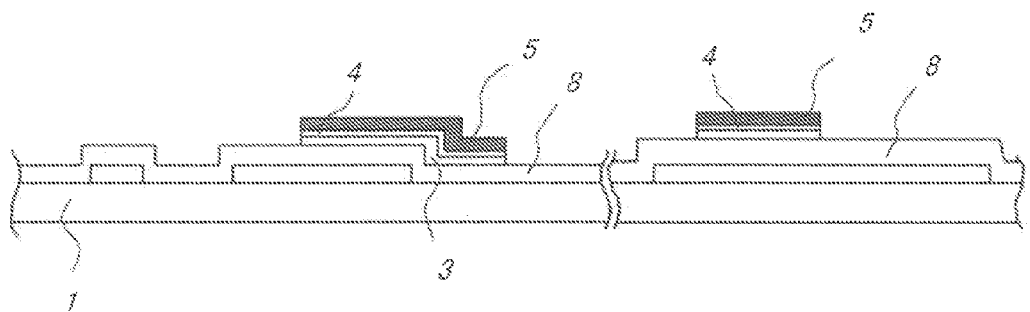

Continuously, the ohmic contact film 4 and the semiconductor layer 3 are etched by using the pattern of the second conductive film 5 patterned as a mask or by using the resist pattern, which has been used when patterning the second conductive film 5 as a mask (i.e., with remaining the resist pattern, which has been used when patterning the second conductive film 5). Thereby, as shown in FIG. 13B, the ohmic contact film 4 and the semiconductor layer 3, which are not covered by the second conductive film 5, are removed. By patterning the ohmic contact film 4 and the semiconductor layer 3 as described above, the patterning of the source wiring 44, the ohmic contact film 4 and the semiconductor layer 3 is sequentially performed in one photolithography process. Also, in the frame area 42, a stacked pattern having the semiconductor film 3, the ohmic contact film 4 and the second conductive film 5 formed at the same layer by the same material of the display area 41 is formed simultaneously with the respective patterns in the display area 41, on the first insulation film 8. This stacked pattern is sequentially etched by the common mask for processing the uppermost second conductive film 5. Accordingly, the respective patterns are formed into the substantially same pattern shapes as the uppermost second conductive film 5.

Figure 13C:
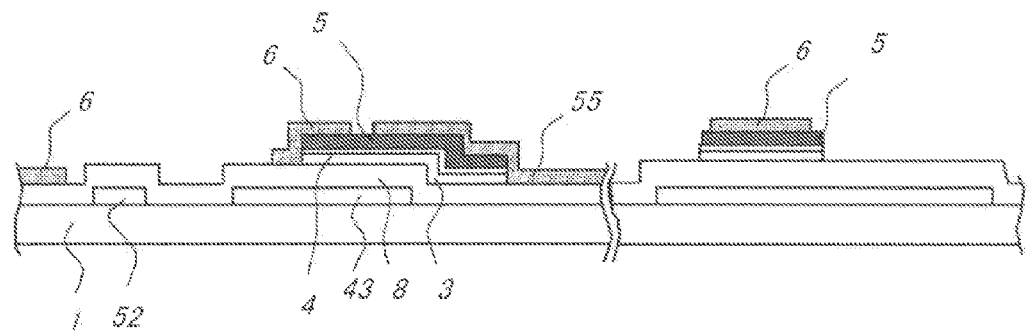

Next, at the state shown in FIG. 13B, a transparent conductive film such as ITO is formed on the whole face of the substrate 1 by the sputtering method and the like. Here, for example, the general ITO has been formed to be amorphous state. By the photolithography process and the fine processing process, the transparent conductive film is patterned. For the processing of the transparent conductive film, the wet etching, in which etchant of weak acid such as oxalic acid appropriate to the etching of the amorphous ITO, is used may be performed. In the first illustrative embodiment, as shown in FIG. 13C, the transparent conductive film is patterned to remain on the formation area of a pixel electrode 55 and on the pattern of the second conductive film 5 except for the channel area of the TFT 51. The transparent conductive film is also patterned to remain on the pattern of the second conductive film 5 in the frame area 42. Thereby, a first transparent conductive film pattern 6 is formed on the source wiring 44 and on an area of the part branched from the source wiring 44, which area to be the source electrode 53. In addition, the pixel electrode 55 is formed so that it partially overlaps with an area of the part branched from the source wiring 44, which area to be the drain electrode 54. Like this, the first transparent conductive film pattern 6 and the pixel electrode 55 are formed at the same layer by the common transparent conductive film, i.e., the same material. Meanwhile, in the above process, the plane pattern shape with respect to the first transparent conductive film pattern 6 and the pixel electrode 55, specifically the plane pattern shape with respect to each of the source electrode 53, the drain electrode 54 and the other metal pattern configured by the second conductive film 5, is formed into the plane pattern shape that has been described regarding the configuration of the first illustrative embodiment.

Figure 14A:
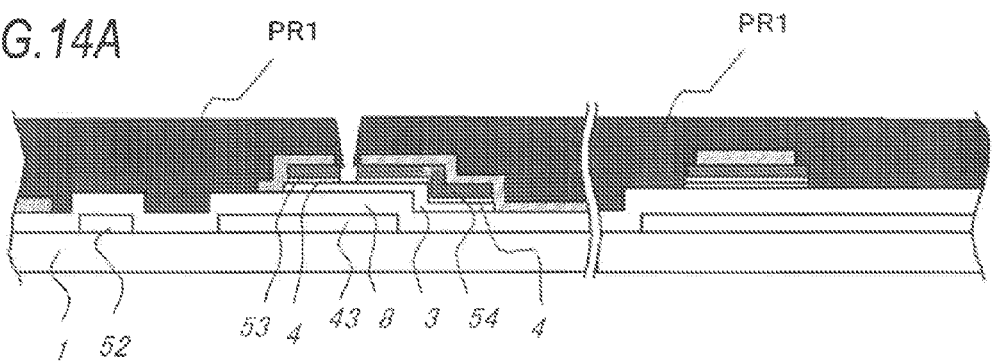
FIGS. 14A, 14B and 14C are sectional views illustrating a method of manufacturing the TFT array substrate according to the first illustrative embodiment of the present invention.

Continuously, the second conductive film 5 and the ohmic contact film 4 above the channel area are removed by the photolithography process and the fine processing process, so that the source electrode 53 and the drain electrode 54 are separated. First, as shown in FIG. 14A, a resist pattern PR1 that opens the upper part of the channel area is formed. By using the resist pattern PR1 as a mask, the second conductive film 5 and the ohmic contact film 4 above the channel area are sequentially etched. Specifically, the second conductive film 5 above the channel area is etched, so that the source electrode 53 and the drain electrode 54 are separated. Furthermore, the ohmic contact film 4 above the channel area, which is exposed as the second conductive film 5 is removed, is removed by the etching. Thereby, as shown in FIG. 14A, the semiconductor layer 3 to be the channel area of the TFT 51 is exposed, and the ohmic contact film 4 of the TFT 51 is separated so that it is arranged only below each of the source electrode 53 and the drain electrode 54. Meanwhile, in the above manufacturing process, both of the patterning of the second conductive film 5 and the patterning of the ohmic contact film 4 and the semiconductor layer 3 are formed by the common resist pattern, and then the patterning of the first transparent conductive film pattern 6 and the pixel electrode 55 and the removing the pattern of the second conductive film 5 and the ohmic contact film 4 above the channel area are sequentially performed. However, the patterning of the ohmic contact film 4 and the semiconductor layer 3 and the patterning of the pattern of the second conductive film 5 may be performed by different patterning, i.e., different photolithography processes. In this case, the patterns of the ohmic contact film 4 and the semiconductor layer 3 may be formed only in the formation area of the TFT 51, and then it may be omitted that the patterns of the ohmic contact film 4 and the semiconductor layer 3, which are arranged: below the second conductive film 5 configuring the source wiring 44; below the second conductive film 5 of the wiring conversion part 45 and the external connection terminal; and below the second conductive film 5 in the structure of the source wiring extension part 44*ex*, the structure of the outermost wiring pattern 59*b* or the structures of the dummy patterns 58*a* to 58*c* to be the auxiliary patterns for reinforcing the adhesive force of the adjacent second insulation film 9. In addition, when the source electrode 53 and the drain electrode 54 are separated originally in patterning the second conductive film 5, the process of forming the resist pattern PR1 for opening the channel area as shown in FIG. 14A may be omitted. In this case, following the patterning of the second conductive film 5, the first transparent conductive film pattern 6 and the pixel electrode 55 are patterned in the same plane pattern as the first illustrative embodiment. Thus, a resist of forming the first transparent conductive film pattern 6 and the pixel electrode 55, which have the opened area above the channel area, may be used to remove the ohmic contact film 4 above the channel area.

Figure 14B:
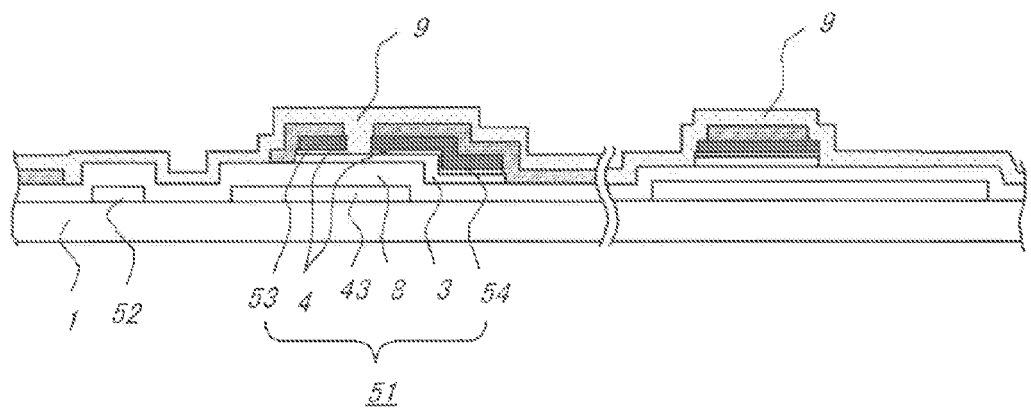

Continuously, from the state shown in FIG. 14A, the resist pattern PR1 is removed. Then, it is formed from above that a second insulation film 9, which is to be an upper layer insulation film covering the pixel electrode 55 and the first transparent conductive film pattern 6 or is to be an interlayer insulation film between electrodes to be formed at the further upper layer. For example, as the second insulation film 9, an inorganic insulation film such as silicon nitride, silicon oxide and the like is formed on the whole face of the substrate 1 by using the CVD method and the like. Thereby, as shown in FIG. 14B, the pixel electrode 55 and the first transparent conductive film pattern 6 are covered by the second insulation film 9. In addition, the channel area of the semiconductor layer 3 is covered by the second insulation film 9. In the meantime, a stacked film may be used as the second insulation film 9 formed by further forming a coated insulation film (formed by coating) on the inorganic insulation film such as silicon nitride, silicon oxide and the like. In the first illustrative embodiment, before forming the second insulation film 9, the plane pattern arrangement with respect to the first transparent conductive film pattern 6 and the pixel electrode 55 optimized to suppress the delamination and the peeling off of the second insulation film 9, specifically the plane pattern arrangement with regard to the metal pattern configured by the source electrode 53, the drain electrode 54 and the second conductive film 5 is adopted. Accordingly, regarding the film formation conditions of the second insulation film 9, it is possible to arbitrarily select the film formation conditions such as the film formation condition of improving the transmittance of the first transparent conductive film pattern 6, the film formation condition of forming a favorable contact end face shape on the face of the first transparent conductive film pattern 6 when forming an opening in the second insulation film 9, the conditions of which promote the delamination. In addition, it is possible to reduce the occurrence frequency of the delamination in the respective conditions. Also, as the film formation condition of improving the transmittance is adopted, the conditions of forming the first transparent conductive film pattern 6 may also promote the delamination of the second insulation film 9. However, by adopting the above-described structures, it is possible to reduce the occurrence frequency of the delamination even when the film formation condition of improving the transmittance is adopted regarding the film formation conditions of the first transparent conductive film pattern 6. In the meantime, the film formation conditions of the second insulation film 9, which improve the transmittance of the first transparent conductive film pattern 6, may include a film formation condition that a material gas having a high content of oxygen should be used in forming a film, more specifically, a film formation condition of forming a silicon oxide film, a film formation condition of forming a silicon nitride film including oxygen, and the like. In the meantime, when forming the opening in the second insulation film 9, the film formation conditions of the second insulation film 9, which form a favorable contact end face shape on the face of the first transparent conductive film pattern 6, may include a film formation condition that a material gas having a high content of nitrogen should be used in forming a silicon nitride film. More specifically, a film formation condition that a partial pressure ratio of nitrogen or ammonia gas in the material gas for film formation is 2 or greater with respect to the silicon containing gas (for example, silane gas, disilane gas, TEOS gas and the like). Furthermore, the film formation conditions of the transparent conductive film such as ITO configuring the transparent conductive film pattern 6 to improve the transmittance of the first transparent conductive film pattern 6 may apply a condition in which an oxygen concentration to be high when forming a film by the sputtering and the like. The film formation conditions of the second conductive film 9 or first transparent conductive film pattern 6 may be respectively used depending on the applications.

Figure 14C:
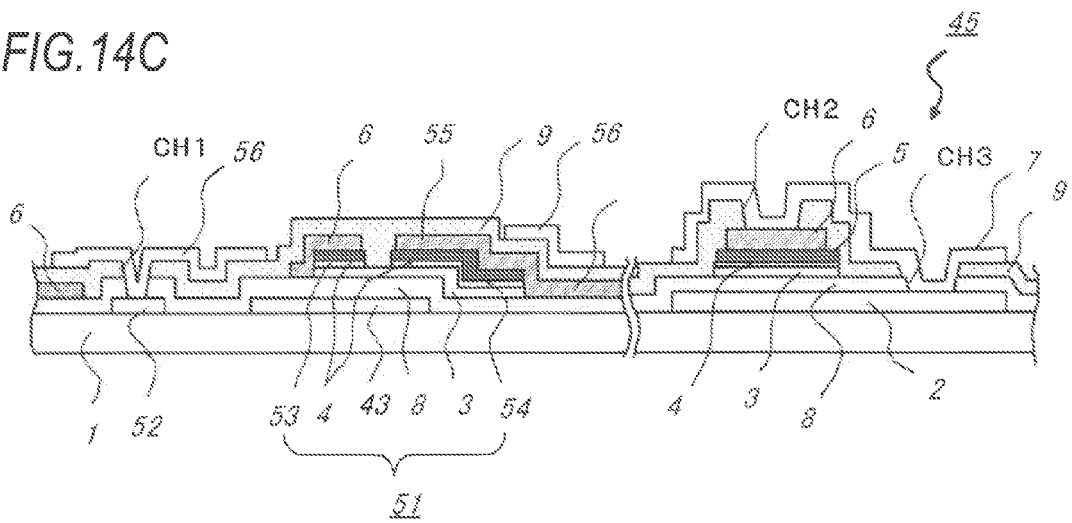

Continuously, contact holes CH1 to CH3 are formed in the second insulation film 9 and the first insulation film 8, by the photolithography process and the fine processing process. Thereby, as shown in FIG. 14C, in the display area 41, the contact hole CH1 reaching the common wiring 52 is formed and the common wiring 52 is partially exposed. Also, in the frame area 42, the contact hole CH2 is formed in the second insulation film 9, and the contact hole CH2 reaches the first transparent conductive film pattern 6 of the stacked pattern, which includes the semiconductor film 3, the ohmic contact film 4, the second conductive film 5 and the transparent conductive film pattern 6. The contact hole CH3 is formed in the second insulation film 9 and the first insulation film 8, and the contact hole CH3 which reaches the metal pattern consisting of the first conductive film 2, Then, a transparent conductive film such as ITO is formed on the second insulation film 9 over the whole face of the substrate 1 by the sputtering method and the like, and then the transparent conductive film is patterned by the photolithography process and the fine processing process. Thereby, an opposite electrode 56 having a slit is formed on an opposite face to the pixel electrode 55 with sandwiching the second insulation film 9 so that the opposite electrode is connected to the common wiring 52 through the contact hole CH1. In the frame area 42, a second transparent conductive film pattern 7, which connects the metal pattern made of the first conductive film 2 and the first transparent conductive film pattern 6 through the contact holes CH2, CH3 formed already, is simultaneously formed at the same layer by the same material as the transparent conductive film forming the opposite electrode 56. In the frame area 42, the wiring conversion part 45 and the external connection terminal, which have been described in the above, are simultaneously formed, and the second transparent conductive film pattern 7 is formed at each of the wiring conversion part 45 and the external connection terminal. The plane pattern shape of the second transparent conductive film pattern 7 at the wiring conversion part 45 and the external connection terminal preferably has the pattern shape that has been described with reference to FIGS. 5, 7 and 8 and the descriptions thereof are thus omitted. By the above processes, the TFT array substrate 100 of the first illustrative embodiment is completed.

An alignment film is formed on the TFT array substrate 100 in a subsequent cell process. Also, an alignment film is formed on an opposite substrate, which is separately manufactured. An alignment process of forming a fine scratch on a contact face to the liquid crystals in one direction is performed for the alignment films by using a rubbing method and the like. Then, the seal material is applied to the periphery part of the substrate, and the TFT array substrate 100 and the opposite substrate are adhered with a predetermined gap so that the alignment films thereof are opposed to each other. After adhering the TFT array substrate 100 and the opposite substrate, the liquid crystals are injected through a liquid crystal injection port by using a vacuum injection method and the like. Then, the liquid crystal injection port is sealed. Polarization plates are attached to both faces of the liquid crystal cell described above and a driving circuit is connected thereto, so that a liquid crystal display panel is formed. Then, a backlight unit is provided to a backside of the TFT array substrate 100, which is the opposite side to a visible side of the liquid crystal display panel, with sandwiching an optical film such as phase difference plate. Then, the liquid crystal display panel and the peripheral members thereof are appropriately accommodated in a frame made of resin, metal and the like, so that the liquid crystal display apparatus of the first illustrative embodiment is completed.

As described above, according to the liquid crystal display apparatus of the first illustrative embodiment, in the area in which the pattern density is relatively low, such as the frame area 42 near the outer side than the display area 41, for example, in the external connection terminal or wiring conversion part 45, the first transparent conductive film pattern 6 is located within the second conductive film 5 as viewed from the top side, so that it is formed to not cover the pattern end faces of the second conductive film 5. Accordingly, it is possible to prevent or suppress the delamination of the second insulation film 9. Further, since the first transparent conductive film pattern 6 sticks out from the pattern end portion of the second conductive film 5, the delamination may be caused on the pixel electrode 55 near the periphery part in the display area 41.

Figure 12:
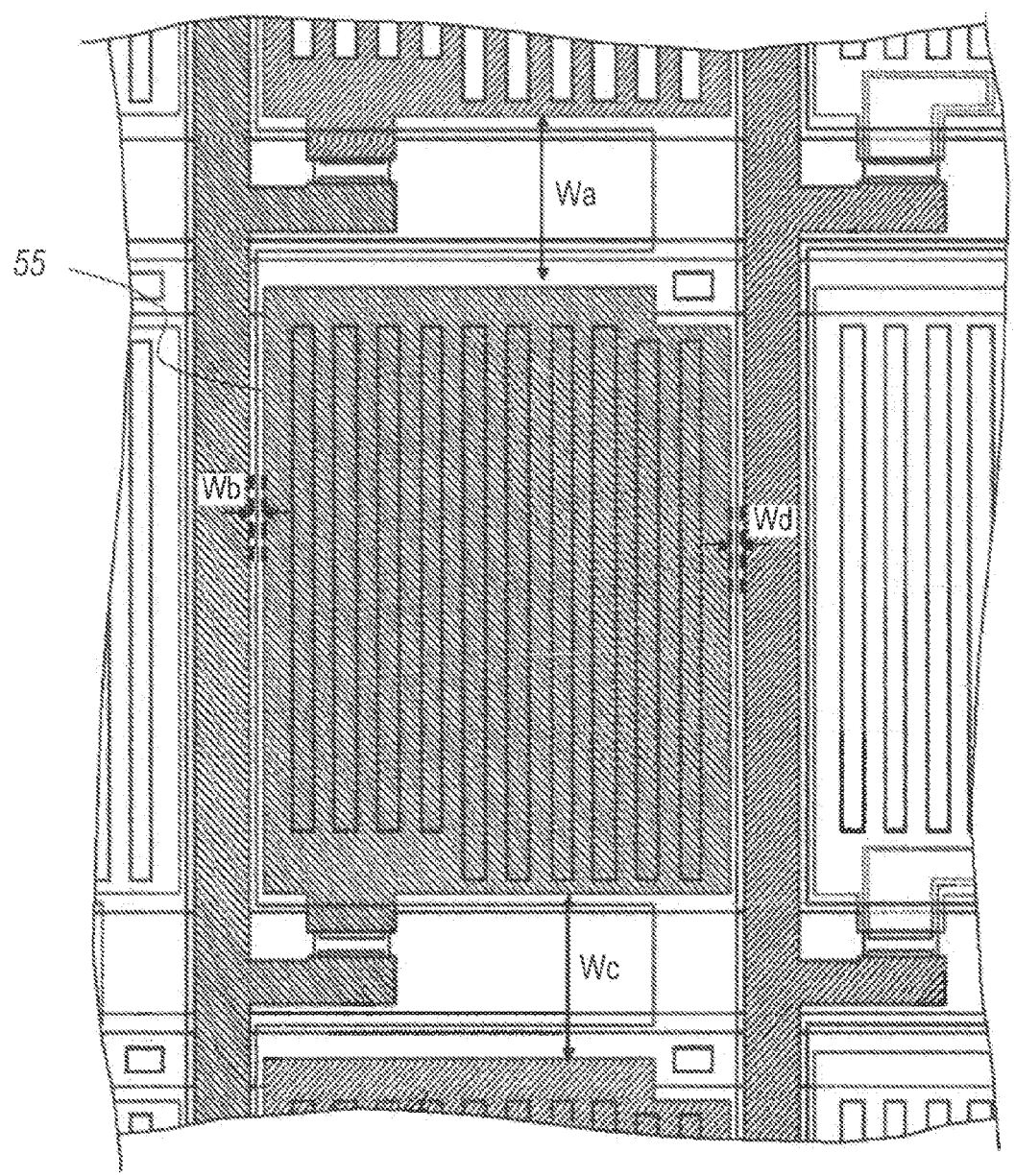
FIG. 12 a plan view illustrating a position relation between pixel electrodes and adjacent patterns of the TFT array substrate according to the first illustrative embodiment of the present invention.

Accordingly, the source wiring extension part 44ex, the outermost wiring pattern 58b and the dummy patterns 58a to 58c, all of which having the different structures from the repeated structure of the inner side of the display area 41, are configured at the outer side of the display area. However, with respect to the repeated structure of the inner side of the display area 41, a special measure is not taken, compared to the periphery part of the pixel electrode 55 in which the delamination may be caused. This is because the delamination is little caused in the repeated parts of the inner side of the display area 41 in the liquid crystal display apparatus having the general pixel density. The reason is as follows. FIG. 12 shows the pixel configuration in the central part of the display area 41 shown in FIG. 3, and the pixel electrodes 55 and the patterns adjacent to the pixel electrodes 55, specifically the patterns formed between the second insulation film 9 and the first insulation film 8 are hatched for explanations. Based on this, distances between the pixel electrodes 55 and the adjacent patterns are about Wa, Wb, Wc and Wd in the respective directions. The distances are regularly same for the respective pixels 50 in the central part of the display area 41. Also, in the liquid crystal display apparatus having the general pixel density, since the distances Wb and Wd correspond to the distances between the pixel electrode 55 and the source wiring 44, the distances are very close, such as 10 µm or shorter. Also, although the distances Wa and Wc correspond to the distances between the pixel electrodes 55 adjacent to each other in the vertical direction, the distances are also close, such as about 20 or 30 µm roughly estimated. Accordingly, such adjacent pattern functions as the adhesive force keeping pattern of the second insulation film 9 at the surrounding vicinity of the pixel electrode 55. Hence, it is suppress the second insulation film 9 from being the peeling off at the surrounding vicinity of the pixel electrode 55, so that the delamination does not occur. As a result, in the liquid crystal display apparatus having the general pixel density, it is not necessary to take the special measure for the repeated part of the inner side of the display area 41.

Figure 15:
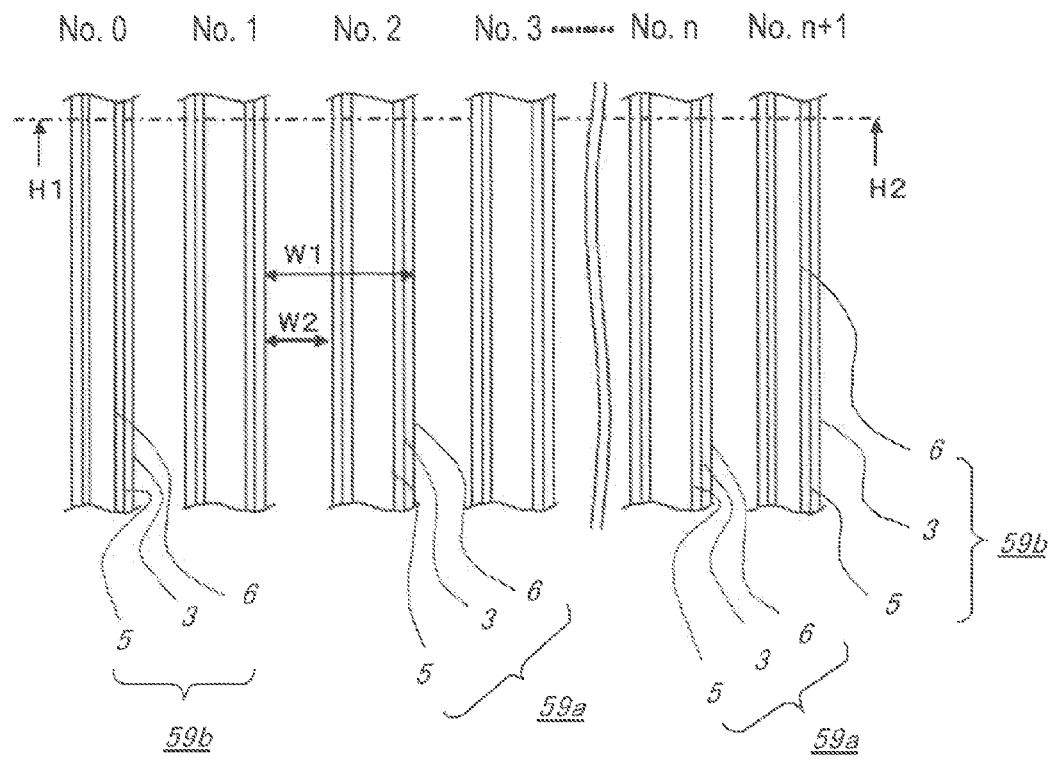
FIG. 15 is a plan view illustrating a relation between a wiring gap and a wiring pitch of the TFT array substrate according to the first illustrative embodiment of the present invention.
Figure 16:
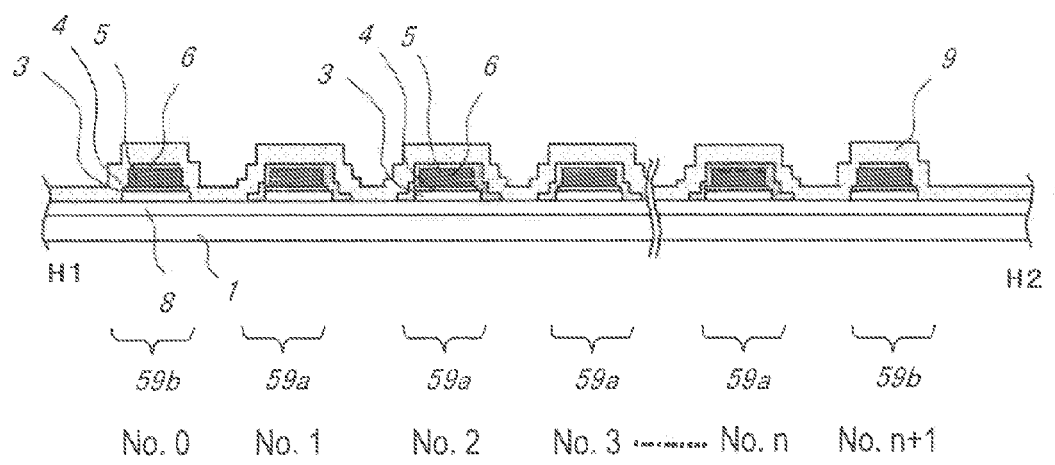
FIG. 16 is a sectional view illustrating a relation between a wiring gap and a wiring pitch of the TFT array substrate according to the first illustrative embodiment of the present invention.

In the below, it will be described that a pixel density from which it is necessary to take a special measure even for the repeated part of the inner side of the display area 41, with including the description of the patterns and the like arranged in the frame area 42. FIGS. 15 and 16 show a general wirings arranged on a TFT array substrate of a liquid crystal display apparatus. Here, it is shown that the present invention is applied to the wirings, in which a pitch between pixels is relatively narrow, in the display area 41, like the TFT array substrate 100 of the first illustrative embodiment. FIG. 15 is a plan view and FIG. 16 is a sectional view taken along a line H1-H2 of FIG. 15. In FIGS. 15 and 16, a configuration of the wirings shown in which wirings from No. 0 to No. n+1 (n: predetermined integer) are arranged with a predetermined pitch (or pattern gap). Like the display area 41 of the TFT array substrate 100 of the first illustrative embodiment, the repeated wirings except for the periphery part correspond to the arrangement wiring patterns 59a (No. 1 to No. n), and the wirings positioned at both ends of the arrangements correspond to the outermost wiring patterns 59b (No. 0 and No. n+1). As shown in FIGS. 15 and 16, the arrangement wiring pattern 59a has the substantially same configuration as the arrangement wiring pattern 59a of the first illustrative embodiment. In other words, the arrangement wiring pattern is the pattern formed by the stacked structure of the semiconductor film 3, the ohmic contact film 4, the second conductive film 5 and the first transparent conductive film pattern 6 on the first insulation film 8 formed on the substrate. And the first transparent conductive film pattern 6 covering the stacked structure sticks out from the inside of the second conductive film 5, to cover the pattern end faces of the second conductive film 5. In particular, the both pattern end faces of the arrangement wiring pattern 59a have the same structure. Additionally, the outermost wiring pattern 59b is the same as the arrangement wiring pattern 59a in that it has the stacked structure of the semiconductor film 3, the ohmic contact film 4, the second conductive film 5 and the first transparent conductive film pattern 6 on the first insulation film 8 formed on the substrate. However, the first transparent conductive film pattern 6 covering the stacked structure is arranged in the second conductive film 5 without sticking out from the pattern end portions of the second conductive film 5. Meanwhile, regarding the outermost wiring pattern 59b shown in FIGS. 15 and 16, the first transparent conductive film pattern is arranged in the second conductive film 5 without sticking from the pattern end portions of the second conductive film 5 at both sides of the outermost wiring pattern 59b. However, the above configuration is adopted for only one end face of the outer side of the display area 41 in the outermost wiring pattern 59b of the first illustrative embodiment. Likewise, the above configuration may be adopted for only one end of the outer side of the wiring pattern group and the same configuration as the arrangement wiring pattern 59a may be adopted for the other end face near the central part of the wiring pattern group.

Figure 17:
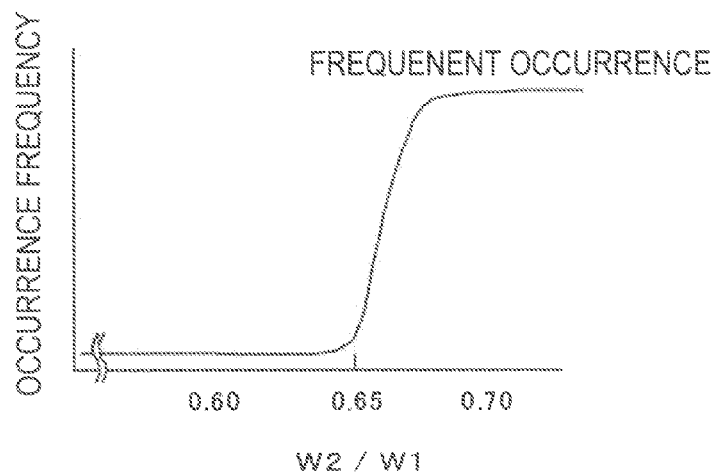
FIG. 17 is a graph illustrating a relation between the wiring gap and wiring pitch and an occurrence frequency of a delamination.

In FIG. 15, regarding the distances of the adjacent patterns of the wiring pattern group, the repetition pitch W1 of the wiring pattern group and the wiring distance W2 are shown. When the configuration for suppressing the delamination is adopted only for the outermost wiring pattern 59b, as shown in FIGS. 15 and 16, the delamination measure is not sufficient in some cases depending on a relation of W1 and W2. Specifically, FIG. 17 shows the dependency of the occurrence frequency of the delamination on the change of the relation of W1 and W2 (a value of W2/W1) when the configuration of FIGS. 15 and 16 is adopted. Since an absolute value of the occurrence frequency is changed by the film formation conditions of the second insulation film 9 to be the upper layer insulation film to cause the delamination, the relative reference values are indicated to the vertical axis without indicating the absolute values. As shown in FIG. 17, when the value of W2/W1 is smaller than 0.65, it is possible to suppress the occurrence frequency of the delamination by the configuration shown in FIGS. 15 and 16 in which the measure is taken only for the arrangement wiring patterns 59a of the wiring patterns. However, when the value of W2/W1 is 0.65 or greater, the occurrence frequency of the delamination is increased, so that the delamination is frequently caused. The reason is as follows. That is, when the value of W2/W1 is small, the adjacent arrangement wiring pattern 59a functions as an auxiliary pattern for reinforcing the adhesive force of the second insulation film 9 with respect to the respective arrangement wiring patterns 59a. Thereby, it is possible to suppress the delamination of the second insulation film 9, which occurs near the end portion of the first transparent conductive film pattern 6 sticking out from the inside area of the pattern of the second conductive film 5 in the arrangement wiring pattern 59a. However, when the value of W2/W1 exceeds a specific value, the adjacent arrangement wiring pattern 59 cannot sufficiently function as the auxiliary pattern for reinforcing the adhesive force of the second insulation film 9, so that the delamination is caused between the arrangement wiring patterns 59a.

Accordingly, when the value of W2/W1 is 0.65 or greater, the arrangement wiring pattern 59a is also preferably configured so that the first transparent conductive film pattern 6, which is formed to have the stacked structure of the semiconductor film 3, the ohmic contact film 4, the second conductive film 5 and the first transparent conductive film pattern 6, is formed at the inner side of the second conductive film 5 without sticking from the pattern end portion of the second conductive film 5, like the outermost wiring pattern 59b. In addition, the pattern end face of the outermost wiring pattern 59b in the central direction of the wiring pattern group is also preferably configured so that the first transparent conductive film pattern 6 is formed at the inner side of the second conductive film 5 without sticking from the pattern end portion of the second conductive film 5, as shown in FIGS. 15 and 16. By the above configuration, it is possible to suppress the delamination between the arrangement wiring patterns 59a in the entire TFT array substrate 100. As an example of the case where the value of W2/W1 is 0.65 or greater, a pitch between the pixels is large such as large-sized liquid crystal display apparatus, rather than the general liquid crystal display apparatus of the first illustrative embodiment. It is caused in a situation in which the value of W2/W1 as the pattern gap is equal to or greater than 0.65. In other words, when the value of W2/W1 is equal to or greater than 0.65, such as a case in the large-sized liquid crystal display apparatus, it is preferable to configure all the arrangement wiring patterns 59a, like the outermost wiring pattern 59b. The relation between W2/W1 and the occurrence frequency of the delamination, which has been described with reference to FIGS. 15 and 16, is not limited to the wiring patterns to be arranged. That is, the similar relation is satisfied for the arrangement patterns having the same layer configuration. In other words, the outermost wiring pattern 59b may be interpreted as the auxiliary pattern for reinforcing the adhesive force described in the first illustrative embodiment. In addition, the relation is not limited to the arrangement pattern and may be considered as a reference of the pattern gap in which it is necessary to closely arrange an auxiliary pattern for reinforcing the adhesive force with respect to a pattern having the same layer configuration as the arrangement wiring patterns 59a having no adjacent pattern.

In the first illustrative embodiment, the flat plate-shape pixel electrode 55 is formed by the transparent conductive film formed at the lower layer, and the comb-shape opposite electrode 56 is formed by the transparent conductive film formed at the upper layer, so that the liquid crystal display apparatus of the FFS mode is configured. In addition, the first transparent conductive film pattern 6, which is formed on the second conductive film 5 formed at the same layer by the same material as the source electrode 53, the drain electrode 54 and the source wiring 44, is formed at the same layer by the transparent conductive film of the same material as the pixel electrode 55. The second transparent conductive film pattern 7, which connects the first conductive film 2 and the first transparent conductive film pattern 6 in the wiring conversion part 45 and the external connection terminal and protects the second conductive film 5, is formed at the same layer by the transparent conductive film of the same material as the opposite electrode 56. However, in the liquid crystal display apparatus of the FFS mode, the pixel electrode 55 and the opposite electrode 56 can be conversely configured. Accordingly, the comb-shape pixel electrode 55 may be configured by the first transparent conductive film pattern 6 formed on the drain electrode 54. Further, the first transparent conductive film pattern 6, which is formed on the source electrode 53 and on the second conductive film 5 formed at the same layer by the same material as the source electrode 53 and the drain electrode 54, may be formed at the same layer by the same material as the comb-shape pixel electrode 53. In this case, since it is necessary to form the flat plate-shape opposite electrode 56 by the transparent conductive film formed at the lower layer below the pixel electrode 55, it is necessary to separately form the transparent conductive film configuring the flat plate-shape opposite electrode 56 and the second transparent conductive film pattern 7, which connects the first conductive film 2 and the first transparent conductive film pattern 6 in the wiring conversion part 45 and the external connection terminal and protects the second conductive film 5.

Second Illustrative Embodiment

With respect to the above described first illustrative embodiment and the modified embodiments thereof, regarding the manufacturing method, the fine processing process, in which the first transparent conductive film pattern 6 and the pixel electrode 55 are processed, and the fine processing process, in which the second conductive film 5 and the ohmic contact film 4 above the channel area are removed and the source electrode 53 and the drain electrode 54 are separated, have been performed by the different photolithography processes, respectively. The liquid crystal display apparatus and the method of manufacturing the same in the second illustrative embodiment will be described. In the second illustrative embodiment, the fine processing process, in which the first transparent conductive film pattern 6 and the pixel electrode 55 is processed, and the fine processing process in which the second conductive film 5 and the ohmic contact film 4 above the channel area are removed and the source electrode 53 and the drain electrode 54 are separated, are performed by the common photolithography process.

First, as can be seen from the pattern shapes of the first transparent conductive film pattern 6 and the pixel electrode 55 in FIG. 13C or the pattern shapes of the first transparent conductive film pattern 6 and the pixel electrode 55 in FIGS. 3 to 11, the area of the second conductive film 5 that is not covered by the first transparent conductive film pattern 6 and the pixel electrode 55 is the upper part above the channel area and the part of the first transparent conductive film pattern 6 and the pixel electrode 55 sticking out from the patterns. Accordingly, even when the second conductive film 5 and the ohmic contact film 4 above the channel area are removed following the processing of the patterns of the first transparent conductive film pattern 6 and the pixel electrode 55, the second conductive film 5 is simply processed in the substantially same width as the first transparent conductive film pattern 6. Also, the width of the first transparent conductive film pattern 6 is beforehand processed to a shape necessary for the second conductive film 5, so that a big problem is not caused. Like this, the fine processing process, in which the first transparent conductive film pattern 6 and the pixel electrode 55 are processed, and the fine processing process, in which the second conductive film 5 and the ohmic contact film 4 above the channel area are removed and the source electrode 53 and the drain electrode 54 are separated, can be continuously performed by the one common photolithography process. Thereby, it is possible to omit the one photolithography process, thereby reducing the processes and the manufacturing cost.

In the meantime, the fine processing process, in which the first transparent conductive film pattern 6 and the pixel electrode 55 are processed, and the fine processing process, in which the second conductive film 5 and the ohmic contact film 4 above the channel area are removed and the source electrode 53 and the drain electrode 54 are separated, are performed by the common photolithography process, so that the position relation between the pattern of both the first transparent conductive film pattern 6 and the pixel electrode 55 and the pattern of the source electrode 53, the drain electrode 54 and the second conductive film 5 formed at the same layer by the same material as the source electrode 53 and the drain electrode 54 is slightly changed. As described in the first illustrative embodiment, the position relation of the patterns has a big influence on the suppressing effect of the delamination of the second insulation film 9. Accordingly, in the second illustrative embodiment, the changed point of the manufacturing method with respect to the fine processing process, in which the first transparent conductive film pattern 6 and the pixel electrode 55 are processed, and the fine processing process, in which the second conductive film 5 and the ohmic contact film 4 above the channel area are removed and the source electrode 53 and the drain electrode 54 are separated, performed by the common photolithography process, the changed part of a TFT array substrate 100a of the obtained liquid crystal display apparatus, compared to the TFT array substrate 100, and the influence of the changed configurations on the suppressing effect of the delamination are described.

Figure 18A:
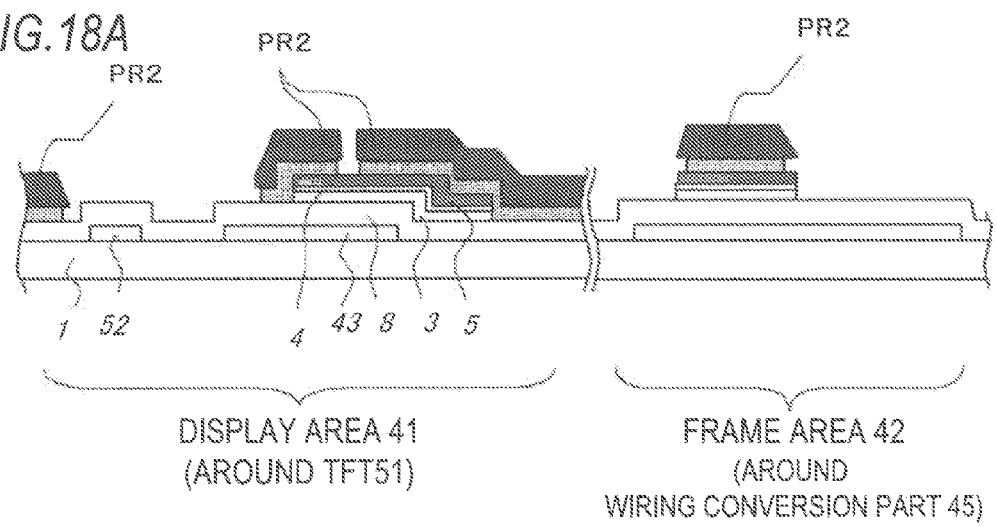
FIGS. 18A and 18B are sectional views illustrating a method of manufacturing a TFT array substrate according to a second illustrative embodiment of the present invention.
Figure 18B:
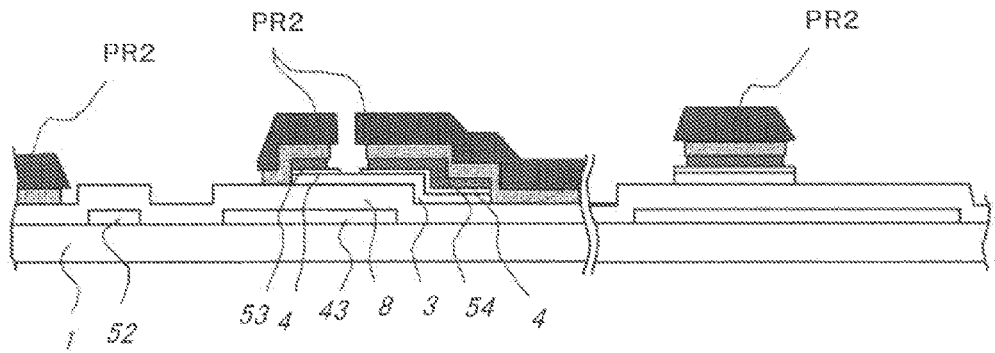

First, the difference of the manufacturing process from the first illustrative embodiment is described with reference to FIG. 18A and FIG. 18B. The second illustrative embodiment is changed from the process shown in FIG. 13C of the first illustrative embodiment. In the manufacturing method of the second illustrative embodiment, as shown in FIG. 18A, a resist pattern PR2 is formed by the photolithography process so that the transparent conductive film is remained: on the formation area of the pixel electrode 55; on the pattern of the second conductive film 5 except for the channel area of TFT 51; and on the pattern of the second conductive film 5 in the frame area 42, and the transparent conductive film is etched and thus patterned. Then, in the first illustrative embodiment, the resist pattern PR2 is also removed, so that the state shown in FIG. 13C is formed. However, in the second illustrative embodiment, as shown in FIG. 18B, the resist pattern PR2 is further used as a mask, so that the second conductive film 5 and the ohmic contact film 4 on the channel area are removed to separate the source electrode 53 and the drain electrode 54. At this time, when the second conductive film 5 is processed by the general wet etching, the slightly longer etching time is selected, considering the non-uniformity of the etching rates. Accordingly, at the point of time of FIG. 18A, the pattern end faces of the first transparent conductive film pattern 6 and the pixel electrode 55 are retreated from the pattern end face of the second conductive film 5, i.e., are surrounded by the pattern of the second conductive film 5, as viewed from the top side, like the first illustrative embodiment. However, as shown in FIG. 18B, after etching the second conductive film 5 and the ohmic contact film 4 on the channel area, the pattern end faces of the second conductive film 5 are slightly retreated from the pattern end faces of the first transparent conductive film pattern 6 and the pixel electrode 55. Also, since the pattern end faces of the ohmic contact film 4 are processed by the dry etching in many cases, they are generally processed at the end face position of the resist pattern PR2, as shown in FIG. 18B. Accordingly, the pattern end faces of the ohmic contact film 4 protrude from the pattern end faces of the second conductive film 5 and the pattern end faces of the first transparent conductive film pattern 6 or pixel electrode 55. In the meantime, it may be also possible that after the processing of removing the second conductive film 5 on the channel area, the transparent conductive film is again etched to retreat the pattern end faces of the first transparent conductive film pattern 6 and the pixel electrode 55 from the pattern end faces of the second conductive film 5. The same structure as the first illustrative embodiment may be formed in which the pattern end faces of the first transparent conductive film pattern 6 are surrounded by the pattern of the second conductive film 5 as viewed from the top side. In this case, although the cost is increased due to the increase of the etching processes of the transparent conductive film, the pattern end faces of the first transparent conductive film pattern 6 and the pixel electrode 55 do not protrude from the pattern end faces of the second conductive film 5, so that it is possible to improve the coverage of the second insulation film 9 to be formed later at the end portions of the patterns of the first transparent conductive film pattern 6 and the pixel electrode 55.

Then, the resist pattern PR2 is removed. Then, the process of forming the upper layer insulation film covering the pixel electrode 55 and the first transparent conductive film pattern 6 or forming the second insulation film 9 to be an interlayer insulation film between electrodes to be formed at the further upper layer after FIG. 14B, the process of forming the contact holes CH1 to CH3 in the second insulation film 9 and the first insulation film 8 shown in FIG. 14C and the patterning process of forming a transparent conductive film on the second insulation film 9 and forming the opposite electrode 56 and the second transparent conductive film pattern 7 are performed, so that the TFT array substrate 100a is completed, like the first illustrative embodiment. Since the subsequent processes of completing the liquid crystal display apparatus is the same as the first illustrative embodiment, the descriptions thereof are omitted.

Figure 20A:
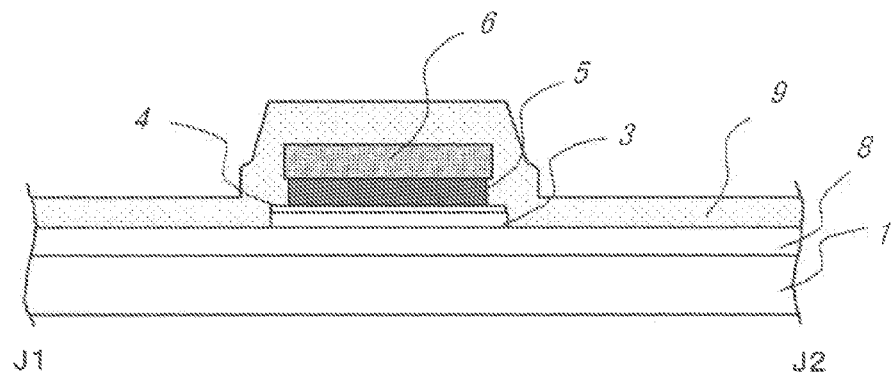
FIGS. 20A and 20B are sectional views illustrating a wiring conversion part of the TFT array substrate according to the second illustrative embodiment of the present invention.
Figure 20B:
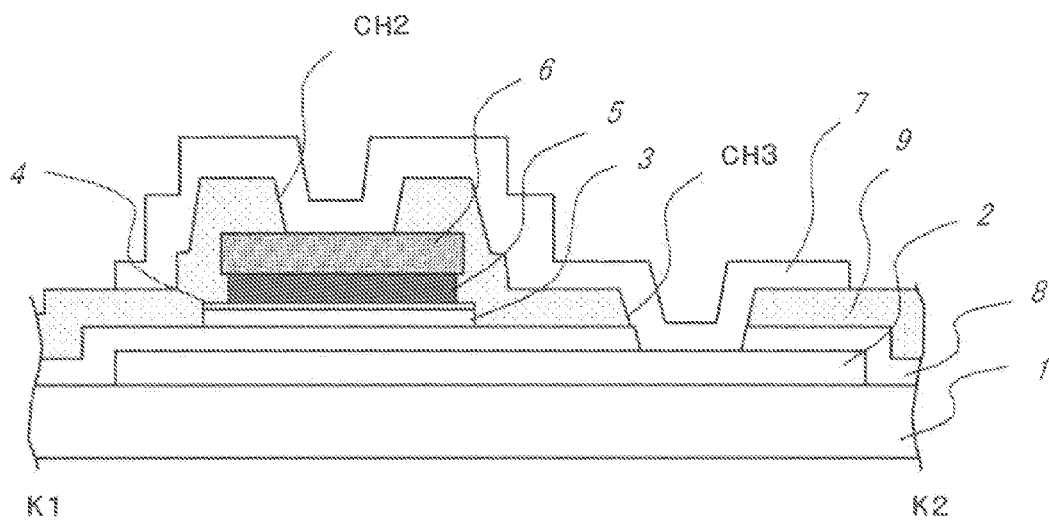

Continuously, the characteristic configurations of the liquid crystal display apparatus according to the above manufacturing method, specifically, the changed configurations of the TFT array substrate 100a (not shown) are described, compared to the TFT array substrate 100 of the first illustrative embodiment. Here, the configuration of a wiring conversion part 45a in the frame area 42, which has a big influence on the suppressing effect of the delamination, is described with reference to FIGS. 19, 20A and 20B. FIG. 19 is a plan view illustrating the wiring conversion part 45a arranged in the frame area 42 of the TFT array substrate 100a according to the second illustrative embodiment, FIG. 20A is a sectional view taken along a line J1-J2 of FIG. 19 and FIG. 20B is a sectional view taken along a line K1-K2 of FIG. 19. As shown in FIG. 19, regarding the areas divided by the dotted line, the upper side is the frame area 42 and the lower side is the display area 41. Like the first illustrative embodiment, the leader wiring 47b1, which is connected to the signal driving circuit 46b, the external wiring 49b and the like, is led from the upper side of the frame area 42 to the wiring conversion part 45a by the first conductive film 2 formed at the same layer by the same material as the gate wiring 43. The extension part of the source wiring 44a in the display area 41 is led from the lower side of the display area 41 to the wiring conversion part 45a by the stacked pattern having the same layer configuration as the source wiring 44a.

First, the specific layer configuration of the extension part of the source wiring 44a will be described with reference to the plan view of FIG. 19 and FIG. 20A illustrating the sectional view taken along a line J1-J2. As shown in FIG. 20A, like the first illustrative embodiment, the first insulation film 8 is formed on the substrate 1. In addition, the stacked film of the semiconductor film 3 and the ohmic contact film 4 formed at the same layer by the same material as the semiconductor film 3 and the ohmic contact film 4 used for the TFT 51 in the display area 41 is formed at the upper layer of the first insulation film 8 and the second conductive film 5 is formed at the upper layer of the ohmic contact film 4 to directly contacted to the ohmic contact film 4.

The second conductive film 5 is the same as the first illustrative embodiment in that it is arranged to overlap with the ohmic contact film 4. However, in the second illustrative embodiment, as described in the above manufacturing method, the pattern end faces of the second conductive film 5 are overlapped so that they are arranged at the positions retreated from the pattern end faces of the ohmic contact film 4 or the pattern end faces of the semiconductor layer 3. In the meantime, the relation between the pattern end faces of the ohmic contact film 3 and the pattern end faces of the semiconductor layer 3 are changed depending on the position relation between the resist pattern PR2 used in the above manufacturing method and the pattern end faces of the semiconductor layer 3. However, the pattern end faces of the ohmic contact film 4 are formed at the substantially same positions as the pattern end faces of the semiconductor layer 3 or at the slightly retreated positions. Here, the substantially same end face positions are considered and it is thus shown in the plan view of FIG. 19 that the outward shape of the pattern of the semiconductor film 3 is overlapped with that of the ohmic contact film 4.

Also, the first transparent conductive film pattern 6 is formed at the upper layer of the second conductive film 5 so that it is directly contacted to the second conductive film 5, which is the same as the first illustrative embodiment. However, in the second illustrative embodiment, both end faces of the pattern of the second conductive film 5 are inwardly retreated from both end faces of the first transparent conductive film 6. Such structure is different from the first illustrative embodiment, in which the first transparent conductive film pattern 6 is located within the pattern of the second conductive film 5 as viewed from the top side. However, also in the second illustrative embodiment, like the first illustrative embodiment, the first transparent conductive film pattern 6 is formed to not cover the pattern end faces of the second conductive film 5 and then only the second conductive film 5 is processed so that the pattern end faces thereof are retreated. Accordingly, as viewed from the top side, the end faces of the first transparent conductive film pattern 6 are positioned at the substantially same positions as the pattern end faces of the second conductive film 5 or slightly stick out. However, as viewed from the sectional face, the end face of the first transparent conductive film pattern 6 protrudes from the pattern end face of the second conductive film 5, so that it is formed to not cover the pattern end face of the second conductive film 5, like the first illustrative embodiment. In the meantime, the positions of the end face of the second conductive film pattern 6 and the pattern end face of the second conductive film 5 are considered to be substantially same and it is thus shown in the plan view of FIG. 19 that the outward shape of the pattern of the second conductive film 5 is overlapped with that of the first transparent conductive film pattern 6. In addition, the second insulation film 9 is formed at the upper layer of the first transparent conductive film pattern 6. The second insulation film 9 is formed to cover the first insulation film 8 and the semiconductor film 3, the ohmic contact film 4, the second conductive film 5 and the first transparent conductive film pattern 6 and is formed while sequentially covering the end faces of the semiconductor film 3, the ohmic contact film 4, the second conductive film 5 and the first transparent conductive film pattern 6.

In addition, as shown in the K1-K2 sectional view of FIG. 20B, the specific layer configuration of connecting and converting between the wirings from the extension part of the source wiring 44a to the leader wiring 47b1 through two openings, the contact hole CH2 and the contact hole CH3 is the same as FIG. 6B of the first illustrative embodiment, except that the end faces of the pattern of the second conductive film 5 are inwardly retreated from the end faces of the first transparent conductive film pattern 6, like the J1-J2 sectional view of FIG. 20A. Hence, the detailed descriptions are omitted.

Further, the configuration of the second illustrative embodiment may be also changed, in addition to the wiring conversion part 45a that has been described as an example. That is, in the first illustrative embodiment, the first transparent conductive film pattern 6 is located within the pattern of the second conductive film 5, as viewed from the top side. However, like the wiring conversion part 45a, the end faces of the pattern of the second conductive film 5 are changed so that they are inwardly retreated from the end faces of the first transparent conductive film pattern 6. Specifically, in the first illustrative embodiment, the external connection terminal part, the structure of the source wiring extension part 44ex, the structure of the outermost wiring pattern 59b formed at the outermost periphery of the display area 41 or the structure of the dummy patterns 58a to 58c, which are applied the same structure, is also changed so that the end faces of the second conductive film 5 are inwardly retreated from the end faces of the first transparent conductive film pattern 6, like the wiring conversion part 45a. In the meantime, like the arrangement wiring patterns 59a that are the wirings except for the periphery part of the display area 41, the configuration part that is the pattern formed by the stacked structure of the semiconductor film 3, the ohmic contact film 4, the second conductive film 5 and the first transparent conductive film pattern 6, and the first transparent conductive film pattern 6 sticks out from the inside area of the pattern of the second conductive film 5 and is formed to cover the pattern end faces of the second conductive film 5 is the same as the first illustrative embodiment because the pattern shape of the second conductive film 5 is not changed.

The above configuration of the second illustrative embodiment is to suppress the delamination regarding the first illustrative embodiment and the end faces of the pattern of the second conductive film 5 are inwardly retreated from the end faces of the first transparent conductive film pattern 6. Such structure is different from the first illustrative embodiment in which the first transparent conductive film pattern 6 is located within the pattern of the second conductive film 5 as viewed from the top side. However, also in the second illustrative embodiment, the first transparent conductive film pattern is formed to not cover the pattern end faces of the second conductive film 5, like the first illustrative embodiment. Accordingly, by the effect of the semiconductor film 3, the ohmic contact film 4 and the second conductive film 5 formed below the first transparent conductive film pattern 6, in particular, by the effect resulting from that the pattern end portions of the first transparent conductive film pattern 6 are formed without contacting the first insulation film 8 at the end portions of the wiring conversion part 45 sandwiched between the first insulation film 8, which is also the gate insulation film of the TFT 51, and the second insulation film 9, it is possible to avoid the stress concentration on the pattern end portions of the first transparent conductive film pattern 6 after the formation of the second insulation film 6. Therefore, like the liquid crystal display apparatus or TFT array substrate 100 of the first illustrative embodiment, the delamination of the second insulation film 9 is hardly caused, so that it is possible to suppress the lowering of the yield rate due to the delamination of the second insulation film 9 and the like and is possible to improve the yield rate.

Third Illustrative Embodiment

In the first and second illustrative embodiments and the modified embodiments thereof, as the transparent conductive film configuring the first transparent conductive film pattern 6 and the pixel electrode 55, the amorphous ITO film is used. This is because it is possible to use the etchant of weak acid, which little generates the damage such as corrosion and the short in the lower wiring and the like, and to thus improve the yield rate and the like. However, for the amorphous ITO film, the heat treatment process, which is performed after the film formation, correctly the patterning, so as to lower the specific resistance of the transparent conductive film, changes the crystalline state of the crystalline ITO. The change of the crystalline state of the first transparent conductive film pattern 6 is accompanied by the slight volume change and the stress change at the periphery part. Accordingly, the stress distortion is caused at an interface between the first transparent conductive film pattern and the second insulation film 9, which is the upper layer insulation film formed above the first transparent conductive film pattern 6, an interface between the first transparent conductive film pattern and the first insulation film 8, which is formed below the first transparent conductive film pattern, or an interface between the second insulation film 9 and the first insulation film 8. In other words, the stress distortion promotes the delamination by the peeling off of the second insulation film 9 near the first transparent conductive film pattern 6. In the liquid crystal display apparatus of the third illustrative embodiment, the material and pattern structure of the first transparent conductive film pattern 6 are changed, so that it is possible to realize the effect equivalent to or higher than the suppressing effect of the delamination by the peeling off of the second insulation film 9 in the first and second illustrative embodiments and the modified embodiments thereof. In the below, the liquid crystal display apparatus of the third illustrative embodiment will be described.

Figure 21:
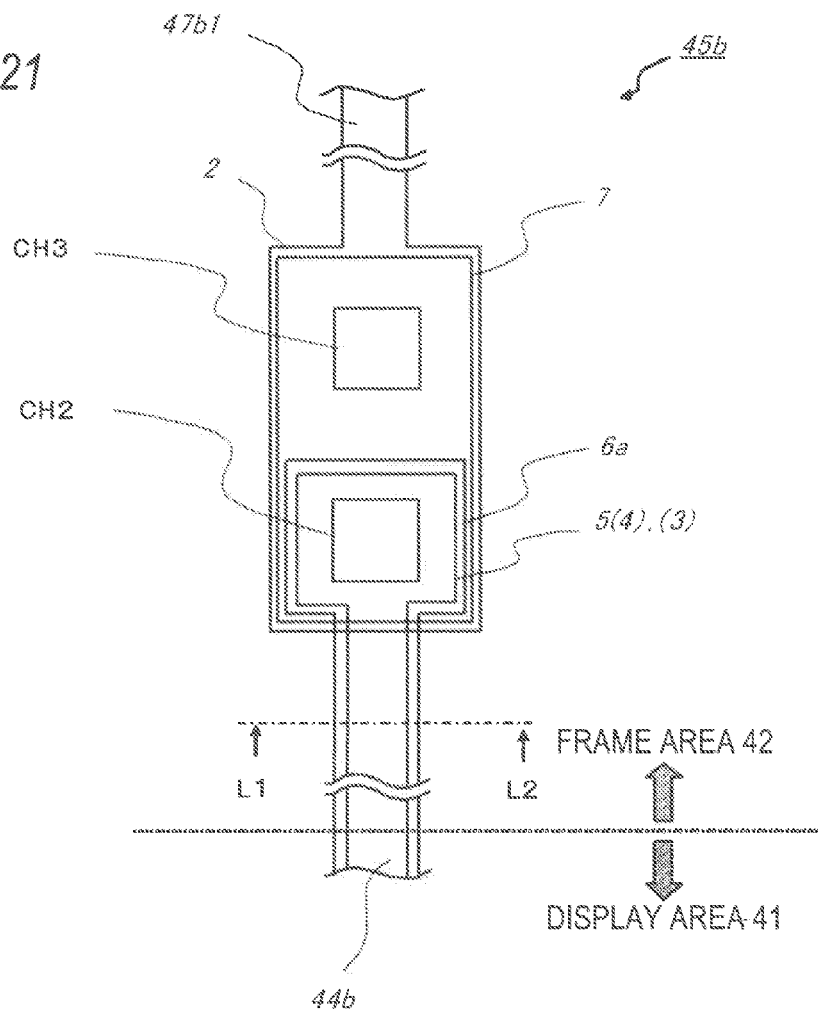
FIG. 21 is a plan view illustrating a wiring conversion part of a TFT array substrate according to a third illustrative embodiment of the present invention.
Figure 22:
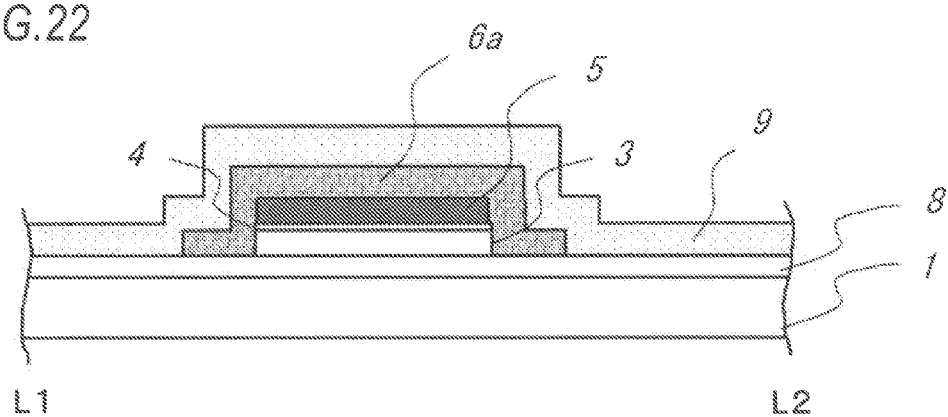
FIG. 22 is a sectional view illustrating a wiring conversion part of the TFT array substrate according to the third illustrative embodiment of the present invention.

First, regarding the characteristic configurations of the liquid crystal display apparatus of the third illustrative embodiment and the configurations of the TFT array substrate 100b (not shown), the configuration of a wiring conversion part 45b in the frame area 42, which has a big influence on the suppressing effect of the delamination, will be described with reference to FIGS. 21 and 22. FIG. 21 is a plan view illustrating the wiring conversion part 45b arranged in the frame area 42 of the TFT array substrate 100b according to the third illustrative embodiment, and FIG. 22 is a sectional view taken along a line L1-L2 of FIG. 21. In the below, the difference from the first illustrative embodiment is described, and the same configuration as the first illustrative embodiment will be appropriately omitted. As shown in FIG. 21, like the first illustrative embodiment, the leader wiring 47b1, which is connected to the signal driving circuit 46b, the external wiring 49b and the like, is led from the upper side of the frame area 42 to the wiring conversion part 45b by the first conductive film 2 formed at the same layer by the same material as the gate wiring 43. The extension part of the source wiring 44b in the display area 41 is led from the lower side of the display area 41 to the wiring conversion part 45a by the stacked pattern having the same layer configuration as the source wiring 44b.

As shown in the L1-L2 sectional view of FIG. 22, in the extension part of the source wiring 44b, a first transparent conductive film pattern 6a, which is made of a transparent conductive film such as IZO (Indium Zinc Oxide; alloy of indium oxide and zinc oxide) and the crystalline state thereof is not changed after the film formation, is formed on the second conductive film 5 to directly contacted to the second conductive film 5. In addition, the first transparent conductive film pattern 6a has a different plane pattern shape from the first transparent conductive film pattern 6 of the first illustrative embodiment. The first transparent conductive film pattern 6a of this illustrative embodiment is arranged to overlap with the second conductive film 5. In other words, the pattern end faces of the semiconductor layer 3, the ohmic contact film 4 and the second conductive film 5 are covered by the first transparent conductive film pattern 6a. The second insulation film 9 is formed at the upper layer of the first transparent conductive film pattern 6a and is also formed to cover the first transparent conductive film pattern 6a. The specific layer configuration of connecting and converting between the wirings from the extension part of the source wiring 44a to the leader wiring 47b1 through two openings, the contact hole CH2 and the contact hole CH3 is the same as FIG. 6B of the first illustrative embodiment, except that the end portions of the pattern of the second conductive film 5 are covered by the first transparent conductive film pattern 6a. Hence, the detailed descriptions are omitted.

Further, the configuration of the third illustrative embodiment may be also changed in addition to the wiring conversion part 45*b* that has been described as an example. That is, in the first illustrative embodiment, the first transparent conductive film pattern 6 is located within the pattern of the second conductive film 5, as viewed from the top side. However, like the wiring conversion part 45*b*, the end portions of the pattern of the second conductive film 5 are changed so that they are covered by the first transparent conductive film pattern 6*a*. Specifically, in the first illustrative embodiment, the external connection terminal part having the same structure, the structure of the source wiring extension part 44*ex* and the structure of the outermost wiring pattern 59*b* formed at the outermost periphery of the display area 41 are changed so that the end portions of the second conductive film 5 are covered by the first transparent conductive film pattern 6*a*, like the wiring conversion part 45*a*. In the meantime, the dummy patterns 58*a* to 58*c* may be omitted. However, when the dummy patterns are arranged, the structures thereof may preferably have the same configuration as the structure of the source wiring extension part 44*ex* and the outermost wiring pattern 59*b* formed at the outermost periphery of the display area 41. In the meantime, the structure of the arrangement wiring patterns 59*a* that are the wirings except for the periphery part of the display area 41 may have the same configuration as the first illustrative embodiment, because the end portions of the pattern of the second conductive film 5 are covered by the first transparent conductive film pattern 6*a* in the first illustrative embodiment, too.

As described above, when the transparent conductive film, whose crystalline state thereof is not changed after the film formation, is used as the first transparent conductive film pattern 6*a*, the stress change is not caused in the transparent conductive film when the transparent conductive film is changed from amorphous state to crystalline state. Accordingly, it is possible to alleviate the stress concentration between the first insulation film 8 and the second insulation film 9 occurring at the pattern end portions of the first transparent conductive film pattern 6 and to suppress the delamination in the structure in which the end portions of the pattern of the second conductive film 5 are covered by the first transparent conductive film pattern 6*a*. Hence, in the liquid crystal display apparatus of the first illustrative embodiment, when it is necessary to form the structure, in which the end portions of the pattern of the second conductive film are covered by the first transparent conductive film pattern 6*a*, even in the area having the low pattern density, the configuration of the third illustrative embodiment is specifically efficient.

In the meantime, in the third illustrative embodiment, the transparent conductive film whose crystalline state is not changed after the film formation means a transparent conductive film whose crystalline state is not changed within a range of heat treatment temperatures for forming the TFT array substrate (typically, about 300° C. or below, about maximum 400° C.). In the third illustrative embodiment, IZO, which is the transparent conductive film whose crystalline state is not changed within a range of heat treatment temperatures (about 300° C. or below, about maximum 400° C.), is used. In addition, a film, which is crystallized when forming a transparent conductive film that keeps the crystalline state and the crystalline state thereof is not changed within a range of heat treatment temperatures (about 300° C. or below, about maximum 400° C.), for example ITO film having crystallinity as-deposited, which is formed while performing the substrate heating process or formed at a state in which a condition of promoting the amorphous film formation such as $H_2O$ atmosphere is not used, may be used. Like this, the stress change is not caused in the transparent conductive film whose crystalline state is not changed after the film formation, when the change from the amorphous transparent conductive film to the crystalline transparent conductive film is made. Accordingly, it is possible to alleviate the stress concentration between the first insulation film 8 and the second insulation film 9 occurring at the pattern end portions of the first transparent conductive film pattern 6 and to thus realize the same effect as the third illustrative embodiment. In the meantime, regarding the transparent conductive film whose crystalline state is not changed after the film formation, the transparent conductive film that keeps the amorphous state and the crystalline state thereof is not changed has the internal stress thereof lower than the transparent conductive film that is crystallized from when forming the film, so that the stress difference between the corresponding transparent conductive film and the second insulation film 9, which is the upper layer insulation film, is suppressed and thus the suppressing effect of the delamination is more high.

In addition, the transparent conductive film, whose crystalline state is not changed after the film formation, may be applied to the first transparent conductive film pattern 6*a* of the first and second illustrative embodiments and the modified embodiments thereof. It is possible to alleviate the stress concentration at the interface between the first transparent conductive film pattern 6 and the second insulation film 9, even in the configuration, in which the first transparent conductive film pattern 6 is formed to not cover the pattern end faces of the semiconductor layer 3, the ohmic contact film 4 and the second conductive film 5, such as the structure of the external connection terminal, the structure of the wiring conversion part 45, the structure of the source wiring extension part 44*ex*, the structure of the outermost wiring pattern 59*b* formed at the outermost periphery of the display area 41 and the structure of the dummy patterns 58*a* to 58*c* of the first and second illustrative embodiments and the modified embodiments thereof. As a result, it is possible to further improve the suppressing effect of the delamination.

Like the first illustrative embodiment, the transparent conductive film pattern 6*a* and the transparent conductive film pattern configuring the pixel electrode 55 of the display area 41 may be formed by the transparent conductive film whose crystalline state is not changed after the film formation, i.e., by the same material. In particular, only for the configuration of the frame area 42 such as external connection terminal or wiring conversion part 45 that has the specific measure effect of the delamination, or the structure of the source wiring extension part 44*ex*, the structure of the outermost wiring pattern 59*b* and the dummy patterns 58*a* to 58*c*, the transparent conductive film pattern may be formed by the transparent conductive film, whose crystalline state is not changed after the film formation, separately from the transparent conductive film pattern configuring the pixel electrode 55.

Figure 23A:
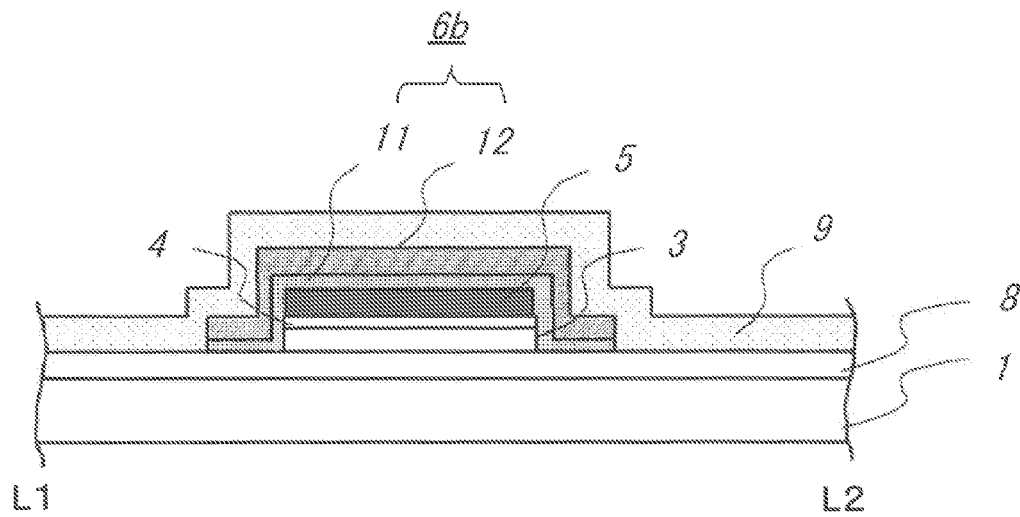
FIGS. 23A and 23B are sectional views illustrating a wiring conversion part of a TFT array substrate according to a modified embodiment of the third illustrative embodiment of the present invention.

In the third illustrative embodiment, the first transparent conductive film pattern 6*a* is configured by the transparent conductive film whose crystalline state is not changed after the film formation. It is preferable that all of the first transparent conductive film pattern 6*a* is configured by the transparent conductive film whose crystalline state is not changed after the film formation, in view of the alleviation effect of the stress concentration. However, even when the first transparent conductive film pattern 6*a* is partially configured by the transparent conductive film whose crystalline state is not changed after the film formation, i.e., by the transparent conductive film including a layer whose crystalline state is not changed, it is possible to realize the alleviation effect of the stress concentration to some extent. For example, in a modified embodiment of the third illustrative embodiment, the transparent conductive film including a layer, whose crystalline state is not changed after the film formation, keeps the amorphous state at the lower layer, as shown in FIG. 23A. In other words, a transparent conductive film pattern 6b configured by a stacked film having a amorphous transparent conductive film 11 whose crystalline state is not changed after the film formation and a crystallized transparent conductive film 12 at the upper layer may be used. In the meantime, the crystallized transparent conductive film 12 may be crystallized when forming the film or may be formed in a amorphous state and then crystallized in the heat treatment process performed after the patterning. By configuring the lower layer of the transparent conductive film pattern 6b with the amorphous transparent conductive film 11 whose crystalline state is not changed after the film formation, i.e., with the layer keeping the amorphous state from after the film formation, even when the crystallized transparent conductive film 12 of the upper layer is crystallized after the film formation, the amorphous transparent conductive film 11, whose crystalline state is not changed, alleviates the stress at the crystallizing time or alleviates the stress at the interface between the first insulation film 8 and the second insulation film 9, so that it is possible to suppress the delamination of the second insulation film 9. In addition, the lower layer is configured by the amorphous transparent conductive film 11, so that it is possible to remove the fine crystalline etching residuals of the transparent conductive film, which are caused when patterning the pixel electrode 55 and the transparent conductive film pattern 6b.

Figure 23B:
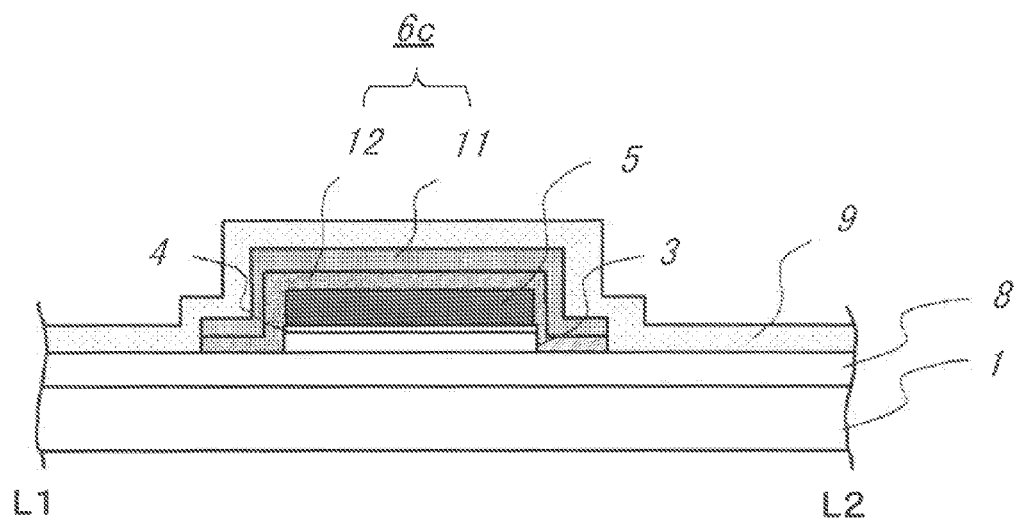

In the modified embodiment of the third illustrative embodiment, as shown in FIG. 23B, the configurations of the amorphous transparent conductive film 11 and the crystallized transparent conductive film 12 may be changed each other. In other words, a transparent conductive film pattern 6c configured by a stacked film having the crystallized transparent conductive film 12 at the lower layer and the amorphous transparent conductive film 11 at the upper layer may be used. Also in this case, by configuring the upper layer of the transparent conductive film pattern 6c with the amorphous transparent conductive film 11 whose crystalline state is not changed after the film formation, even when the crystallized transparent conductive film 12 is crystallized after the film formation, the amorphous transparent conductive film 11 whose crystalline state is not changed alleviates the stress at the crystallizing time or alleviates the stress at the interface between the first insulation film 8 and the second insulation film 9, so that it is possible to suppress the delamination of the second insulation film 9. In addition, the transparent conductive film keeping the amorphous state from after the film formation is at least partially included in the transparent conductive film whose crystalline state is not changed after the film formation, so that it is possible to alleviate the stress caused at the crystallizing time of the crystallized transparent conductive film 12.

In the third illustrative embodiment and the modified embodiments thereof, the material and pattern structure of the first transparent conductive film pattern 6 are changed, so that it is possible to realize the effect equivalent to or higher than the suppressing effect of the delamination by the peeling off of the second insulation film 9 in the first and second illustrative embodiments and the modified embodiments thereof. In the meantime, the first insulation film 8, which is the lower layer at which the second insulation film 9 above the first transparent conductive film pattern 6 is formed, and its surface state also have a big influence on the ease of the peeling off of the second insulation film 9. In the below, a modified embodiment will be described in which the material, configuration and the like of the first insulation film pattern 8 are changed, so that it is possible to realize the effect equivalent to or higher than the suppressing effect of the delamination by the peeling off of the second insulation film 9 in the first, second and third illustrative embodiments and the modified embodiments thereof.

Figure 24:
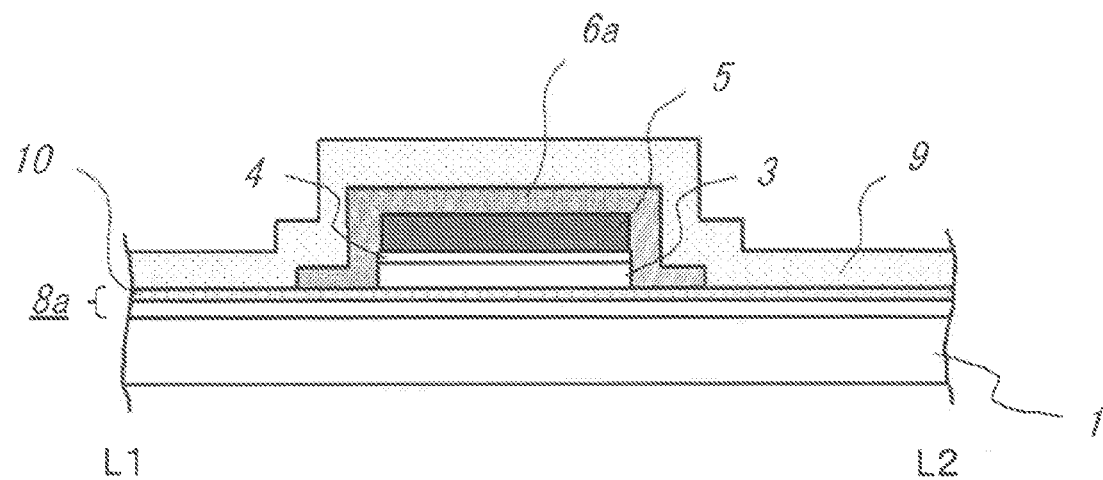
FIG. 24 is a sectional view illustrating a wiring conversion part of a TFT array substrate according to a modified embodiment of the third illustrative embodiment of the present invention.

FIG. 24 is a sectional view of the wiring conversion part according to the modified embodiment of the third illustrative embodiment, in which the material, configuration and the like of the first insulation film pattern 8 are changed. Here, the configurations that are partially changed from FIG. 22 of the third illustrative embodiment are shown at the same positions. In the below, the difference from the third illustrative embodiment is preponderantly described, and the same configuration as the third illustrative embodiment is appropriately omitted.

As shown in FIG. 24, a first insulation film 8a is formed on the whole face of the substrate 1 made of transparent insulating material such as glass. The first insulation film 8a configured by at least two layers in which the upper layer is made of insulation film 10 containing oxygen, such as silicon oxide. The other configurations are the same as that of FIG. 22 of the third illustrative embodiment and the descriptions thereof are omitted. As shown in FIG. 24, the first insulation film 8a has the oxygen containing insulation layer on the face facing the second insulation film 9 that is the upper layer insulation film.

In the above modified embodiment, the upper layer of the first insulation film 8a is configured by the oxygen containing insulation film 10. Thereby, the oxygen containing insulation film 10 functions as a stress alleviating layer, so that the stress concentration caused at the pattern ends of the first transparent conductive film pattern 6a is alleviated, and the delamination can be thus suppressed. In the meantime, although silicon oxide ($SiO_2$) is exemplified as the oxygen containing insulation film 10, the other oxygen containing films such as SiON may be used. In addition, since the first insulation film 8a preferably has the oxygen containing insulation layer at least on the face facing the second insulation film 9 that is the upper layer insulation film, a film having a gradient composition in which the oxygen concentration is gradually increased toward the face of the first insulation film 8a may be used, rather than the clear two-layered structure. By the configuration, it is also possible to realize the same effect.

In addition, the configuration of the first insulation film 8a having the oxygen containing insulation film 10 on the face thereof is commonly used over the whole face of the substrate 1. Accordingly, it is possible to obtain the same effects in the configurations having the first transparent conductive film pattern 6a, which covers the patterns of the semiconductor layer 3, the ohmic contact film 4 and the second conductive film 5 formed above the first insulation film 8a on the substrate 1, and the second insulation film 9 that is the upper layer insulation film formed to cover the above. Furthermore, although the modified embodiment of the third illustrative embodiment is described, it is possible to realize the above-described effects even when any of the first transparent conductive film 6 of the first and second illustrative embodiment and the first transparent conductive film 6b and first transparent conductive film 6c of the modified embodiment of the third illustrative embodiment is used. Furthermore, in the first to third illustrative embodiments and the modified embodiments thereof, by changing the first insulation film 8 into the first insulation film 8a, it is possible to obtain the same effects in the configurations having the first transparent conductive film pattern 6a, which covers the patterns of the semiconductor layer 3, the ohmic contact film 4 and the second conductive film 5 formed above the first insulation film 8a on the substrate 1, and the second insulation film 9 that is the upper layer insulation film formed to cover the above. In the meantime, even in the configurations in which the first transparent conductive film pattern 6 is formed to not cover the pattern end faces of the semiconductor layer 3, the ohmic contact film 4 and the second conductive film 5, such as the structure of the external connection terminal, the structure of the wiring conversion part 45, the structure of the source wiring extension part 44ex, the structure of the outermost wiring pattern 59b formed at the outermost periphery of the display area 41 and the structure of the dummy patterns 58a to 58c in the first and second illustrative embodiments and the modified embodiments thereof, it is possible to alleviate the stress concentration at the interface between the first insulation film 8a and the first transparent conductive film pattern 6 or second insulation film 9 by changing the first insulation film 8 into the first insulation film 8a, so that it is possible to further improve the suppressing effect of the delamination.

In the first to third illustrative embodiments and the modified embodiments thereof, the liquid crystal display apparatus of the FFS mode has been described as an example of the TFT array substrate having the transparent conductive film. However, since the liquid crystal display apparatus of the FFS mode has the transparent conductive films of two layers for pixel and opposite electrodes on the TFT array substrate, it has been just described as an appropriate example. That is, a thin film electronic device in which at least the transparent conductive films are used for a transparent electrode for a display apparatus and for a terminal electrode of the external connection terminal may be also exemplified. In addition to the liquid crystal display apparatus, the thin film electronic device having the thin film transistor array substrate may include a flat plane-type display apparatus (flat panel display) such as organic EL display apparatus, and a semiconductor device such as a photoelectric conversion device as image sensor in addition to the display apparatus, and the like. Since the same problems are also caused in the thin film transistor array substrate used in the above devices, in case that the transparent conductive film, specifically the transparent conductive film formed to directly contacted to a metal pattern, is provided, and the upper layer insulation film is formed on the transparent conductive film, the present invention can be applied thereto. In addition, it is possible to realize the same effect by applying the configurations of the first to third illustrative embodiments and the modified embodiments thereof.

As described above, the respective embodiments are exemplary and are not limitative. The scope of the present invention is defined in the claims, and all modifications equivalent to the claims and within the claims are included therein.

What is claimed is:

1. A thin film transistor (TFT) array substrate having an array area, in which thin film transistors are arranged in an array shape, and a frame area, which is provided to surround the array area, the thin film transistor array substrate comprising:
   a thin film transistor includes:
      a substrate;
      a gate electrode formed on the substrate;
      a gate insulation film that covers the substrate and also covers the gate electrode;
      a semiconductor layer formed on the gate insulation film above the gate electrode; and
      a source electrode and a drain electrode formed above the semiconductor layer with sandwiching an ohmic contact film;
   an electrode pattern configured by the source electrode and the drain electrode;
   an upper metal pattern formed by the same material as the source and drain electrodes at the same layer;
   a transparent conductive film pattern formed to directly overlap with at least one of the electrode pattern and the upper metal pattern; and
   an upper layer insulation film that covers the gate insulation film and also covers the transparent conductive film pattern,
   wherein the transparent conductive film pattern has:
      a first-type transparent conductive film pattern that is provided to be located within one of a pattern of the electrode pattern and a pattern of the upper metal pattern, as viewed from the top side, wherein a first-type transparent conductive film pattern is formed to not cover pattern end faces of the electrode pattern or the upper metal pattern; and
      a second-type transparent conductive film pattern that is provided to stick out from an inside of at least a portion of one of the electrode pattern and the upper metal pattern, as viewed from the top side, wherein the second-type transparent conductive film pattern is stuck out to cover the pattern end faces of the electrode pattern or the upper metal pattern, and
   wherein the transparent conductive film pattern formed at least in the frame area is configured by the first-type transparent conductive film pattern formed to not cover the pattern end faces of the electrode pattern or the upper metal pattern.

2. A thin film transistor array (TFT) substrate having an array area, in which thin film transistors are arranged in an array shape, and a frame area, which is provided to surround the array area, the thin film transistor array substrate comprising:
   a thin film transistor includes:
      a substrate;
      a gate electrode formed on the substrate;
      a gate insulation film that covers the substrate and also covers the gate electrode;
      a semiconductor layer formed on the gate insulation film above the gate electrode; and
      a source electrode and a drain electrode formed above the semiconductor layer with sandwiching an ohmic contact film;
   an electrode pattern configured by the source electrode and the drain electrode;
   an upper metal pattern formed by the same material as the source and drain electrodes at the same layer;
   a transparent conductive film pattern formed to directly overlap with at least one of the electrode pattern and the upper metal pattern; and
   an upper layer insulation film that covers the gate insulation film and also covers the transparent conductive film pattern,
   wherein the transparent conductive film pattern has:
      a first-type transparent conductive film pattern that is provided to protrude from an end face of a pattern of the electrode pattern and a pattern of the upper metal pattern, as viewed from cross-section, wherein first-type transparent conductive film pattern is formed to not cover pattern end faces of the electrode pattern or the upper metal pattern, and
      a second-type transparent conductive film pattern that is provided to stick out from an inside of at least a portion of one of the electrode pattern and the upper metal pattern, as viewed from the top side, wherein the second-type transparent conductive film pattern is stuck out to cover the pattern end faces of the electrode pattern or the upper metal pattern, and wherein the transparent conductive film pattern formed at least in the frame area is configured by the first-type transparent conductive film pattern formed to not cover the pattern end faces of the electrode pattern or the upper metal pattern.

3. The TFT array substrate according to claim 1, wherein the upper metal pattern and the first-type transparent conductive film pattern, which is formed to not cover the pattern end faces of the upper metal pattern, are formed in the frame area configure a wiring conversion part or external connection terminal.

4. The TFT array substrate according to claim 3, further comprising:

an upper layer transparent conductive film pattern that is connected to the transparent conductive film pattern through a first contact hole provided by opening in the upper layer insulation film on the first-type transparent conductive film pattern formed to not cover the pattern end faces of the upper metal pattern, wherein the upper layer transparent conductive film pattern is formed to cover from an inside of the first contact hole to an outer side of the upper metal pattern, as viewed from the top side, above the upper layer insulation film.

5. The TFT array substrate according to claim 3, further comprising:

an upper layer transparent conductive film pattern that is connected to a lower layer transparent conductive film being the transparent conductive film pattern through a first contact hole that is provided by opening in the upper layer insulation film on the first-type transparent conductive film pattern formed to not cover the pattern end faces of the upper metal pattern;

a lower metal pattern formed by the same material at the same layer as the gate electrode; and a second contact hole that penetrates both the gate insulation film and the upper layer insulation film above the lower metal pattern formed by the same material at the same layer as the gate electrode;

wherein the upper layer transparent conductive film pattern is connected to the lower metal pattern through the second contact hole penetrating the gate insulation film and the upper layer insulation film above the upper metal pattern, and wherein the lower metal pattern is connected to the transparent conductive film pattern.

6. A thin film transistor (TFT) array substrate having an array area, in which thin film transistors are arranged in an array shape, and a frame area, which is provided to surround the array area, the thin film transistor array substrate comprising:

a thin film transistor includes:
a substrate;
a gate electrode formed on the substrate;
a gate insulation film that covers the substrate and also covers the gate electrode;
a semiconductor layer formed on the gate insulation film above the gate electrode; and
a source electrode and a drain electrode formed above the semiconductor layer with sandwiching an ohmic contact film;
an electrode pattern configured by the source electrode and the drain electrode;
an upper metal pattern formed by the same material as the source and drain electrodes at the same layer;

a transparent conductive film pattern formed to directly overlap with at least one of the electrode pattern and the upper metal pattern; and an upper layer insulation film that covers the gate insulation film and also covers the transparent conductive film pattern, wherein the transparent conductive film pattern has:
a stuck-out transparent conductive film pattern that is provided to stick out from an inside of at least a portion of one of the electrode pattern and the upper metal pattern, as viewed from the top side, wherein the stuck-out transparent conductive film pattern is stuck out to cover the pattern end faces of the electrode pattern or the upper metal pattern; and
an auxiliary pattern that is provided to near side of a sticked pattern side face, at which the transparent conductive film pattern is stuck out.

7. The TFT array substrate according to claim 6, wherein the auxiliary pattern is provided to close to the stuck-out transparent conductive film pattern in the frame area, which is provided to stick out from the inside of at least a portion of the upper metal pattern, as viewed from the top side, and to cover the pattern end faces of the electrode pattern or the upper metal pattern.

8. The TFT array substrate according to claim 6, wherein, when it is arranged that a plurality of the stuck-out transparent conductive film pattern provided to stick out from an inside of at least a portion of one of the electrode pattern and the upper metal pattern as viewed from the top side and to cover the pattern end faces of the electrode pattern or the upper metal pattern, the auxiliary pattern is provided to close to an outermost transparent conductive film pattern, which is provided at outermost, of the plurality of the transparent conductive film pattern.

9. The TFT array substrate according to claim 6, wherein the auxiliary pattern configured by a film including at least one layer formed at the same layer by the same material as a film configuring the thin film transistor formed below the upper layer insulation film.

10. The TFT array substrate according to claim 6, wherein the auxiliary pattern has a stacked structure of the upper metal pattern and the transparent conductive film pattern formed to directly overlap with the metal pattern, and wherein, in at least an opposing pattern side face, which opposites to the near side of the stuck-out transparent conductive film that is provided to stick out from an inside of at least a portion of one of the electrode pattern and the upper metal pattern as viewed from the top side and to cover the pattern end faces of the electrode pattern or the upper metal pattern, the transparent conductive film configuring the auxiliary pattern is formed to not cover pattern end faces of the metal pattern configuring the auxiliary pattern.

11. A thin film transistor (TFT) array substrate having an array area, in which thin film transistors are arranged in an array shape, and a frame area, which is provided to surround the array area, the thin film transistor array substrate comprising:

a thin film transistor includes:
a substrate;
a gate electrode formed on the substrate;
a gate insulation film that covers the substrate and also covers the gate electrode;
a semiconductor layer formed on the gate insulation film above the gate electrode; and a source electrode and a drain electrode formed above the semiconductor layer with sandwiching an ohmic contact film;

an electrode pattern configured by the source electrode and the drain electrode;

an upper metal pattern formed by the same material as the source and drain electrodes at the same layer;

a transparent conductive film pattern formed to directly overlap with at least one of the electrode pattern and the metal pattern; and an upper layer insulation film that covers the gate insulation film and also covers the transparent conductive film pattern, wherein the transparent conductive film pattern has a transparent conductive film pattern that is provided to stick out from an inside of at least a portion of one of the electrode pattern and the metal pattern, as viewed from the top side, wherein the transparent conductive film pattern is stuck out to cover the pattern end faces of the electrode pattern or the metal pattern, and wherein the transparent conductive film pattern is includes a transparent conductive film layer, whose crystalline state is not changed from after film formation.

12. The TFT array substrate according to claim 11, wherein the layer whose crystalline state is not changed from after the film formation is formed to keep at least a amorphous state from after the film formation.

13. A thin film transistor (TFT) array substrate having an array area, in which thin film transistors are arranged in an array shape, and a frame area, which is provided to surround the array area, the thin film transistor array substrate comprising:

a thin film transistor includes:
  a substrate;
  a gate electrode formed on the substrate;
  a gate insulation film that covers the substrate and also covers the gate electrode;
  a semiconductor layer formed on the gate insulation film above the gate electrode; and
  a source electrode and a drain electrode formed above the semiconductor layer with sandwiching an ohmic contact film;

an electrode pattern configured by the source electrode and the drain electrode;

an upper metal pattern formed by the same material as the source and drain electrodes at the same layer;

a transparent conductive film pattern formed to directly overlap with at least one of the electrode pattern and the metal pattern, and an upper layer insulation film that covers the gate insulation film and also covers the transparent conductive film pattern, wherein the transparent conductive film pattern comprises a transparent conductive film pattern that is provided to stick out from an inside of at least a portion of one of the electrode pattern and the metal pattern, as viewed from the top side, wherein the transparent conductive film pattern is stuck out to cover the pattern end faces of the electrode pattern or the metal pattern, and wherein the gate insulation film has an oxygen containing insulation layer at least on a face facing the upper layer insulation film.

14. A liquid crystal display apparatus comprising the TFT array substrate according to claim 4, the liquid crystal display apparatus comprising:

a flat plate-shape electrode configured by a transparent conductive film pattern, which is formed in the array area and is formed at the same layer by the same material as the transparent conductive film pattern formed in the frame area to not cover the pattern end faces of the upper metal pattern, and a comb-shape electrode configured by a transparent conductive film pattern, which is formed in the array area and is formed at the same layer by the same material as the upper layer transparent conductive film formed in the frame area, wherein comb-shape electrode and being arranged above the flat plate-shape electrode with sandwiching the upper layer insulation film, wherein the flat plate-shape electrode is used as a pixel electrode, which is connected to the thin film transistor and a display potential is applied thereto, and wherein the comb-shape electrode is used as an opposite electrode, to which a common potential is applied, so that a fringe electric field is generated between the pixel electrode and the opposite electrode, thereby driving liquid crystals.

15. A liquid crystal display apparatus comprising the TFT array substrate according to claim 6, the liquid crystal display apparatus comprising:

a flat plate-shape electrode configured by a transparent conductive film pattern, which is formed in the array area and is formed at the same layer by the same material as the transparent conductive film pattern formed to directly overlap with one of the electrode pattern and the upper metal pattern; and a comb-shape electrode configured by an upper layer transparent conductive film pattern, which is formed in the frame area and is connected to the transparent conductive film pattern through a first contact hole provided by opening in the upper layer insulation film above the transparent conductive film pattern formed to directly overlap with the upper metal pattern; and a transparent conductive film pattern, which is formed in the array area and is formed at the same layer by the same material as the upper layer transparent conductive film pattern, wherein the transparent conductive film is arranged on the flat plate-shape electrode with sandwiching the upper layer insulation film, wherein the flat plate-shape electrode is used as a pixel electrode, which is connected to the thin film transistor and a display potential is applied thereto, and wherein the comb-shape electrode is used as an opposite electrode, to which a common potential is applied, so that a fringe electric field is caused between the pixel electrode and the opposite electrode, thereby driving liquid crystals.

* * * * *